US008754472B2

(12) United States Patent
Lu et al.

(10) Patent No.: US 8,754,472 B2
(45) Date of Patent: Jun. 17, 2014

(54) METHODS FOR FABRICATING TRANSISTORS INCLUDING ONE OR MORE CIRCULAR TRENCHES

(75) Inventors: Hamilton Lu, Los Angeles, CA (US); Laszlo Lipcsei, Campbell, CA (US)

(73) Assignee: O2Micro, Inc., Santa Clara, CA (US)

( * ) Notice: Subject to any disclaimer, the term of this patent is extended or adjusted under 35 U.S.C. 154(b) by 0 days.

(21) Appl. No.: 13/044,997

(22) Filed: Mar. 10, 2011

(65) Prior Publication Data

US 2012/0228699 A1 Sep. 13, 2012

(51) Int. Cl.
*H01L 29/76* (2006.01)

(52) U.S. Cl.
USPC .......................................... 257/332

(58) Field of Classification Search
USPC .......................................... 257/332
See application file for complete search history.

(56) References Cited

U.S. PATENT DOCUMENTS

| | | | |
|---|---|---|---|
| 5,262,353 A | 11/1993 | Sun et al. | |
| 5,285,093 A * | 2/1994 | Lage et al. | 257/332 |
| 5,554,870 A * | 9/1996 | Fitch et al. | 257/334 |
| 5,682,052 A | 10/1997 | Hodges et al. | |
| 5,960,280 A | 9/1999 | Jenq et al. | |
| 6,100,173 A | 8/2000 | Gardner et al. | |
| 6,251,730 B1 | 6/2001 | Luo | |
| 6,717,210 B2 | 4/2004 | Takano et al. | |
| 6,806,126 B1 | 10/2004 | Luning et al. | |
| 7,253,473 B2 | 8/2007 | Nakamura et al. | |
| 2002/0053711 A1 | 5/2002 | Chau et al. | |
| 2003/0020102 A1 | 1/2003 | Gajda | |
| 2005/0056890 A1 | 3/2005 | Yasuhara et al. | |
| 2005/0196947 A1 | 9/2005 | Seo et al. | |
| 2006/0134844 A1 | 6/2006 | Lu et al. | |
| 2007/0082440 A1 | 4/2007 | Shiratake | |
| 2007/0131986 A1 | 6/2007 | Hwang | |
| 2009/0224312 A1 | 9/2009 | Taketani | |
| 2009/0242977 A1 | 10/2009 | Kawaguchi et al. | |
| 2010/0044796 A1 | 2/2010 | Hshieh | |

FOREIGN PATENT DOCUMENTS

| | | |
|---|---|---|
| EP | 1205980 A1 | 5/2002 |
| JP | 6-196694 A | 7/1994 |
| JP | 8-23092 A | 1/1996 |
| JP | 2004-95962 A | 3/2004 |
| JP | 2006-114834 A | 4/2006 |
| JP | 2009-135354 A | 6/2009 |
| JP | 2009-170532 A | 7/2009 |
| KR | 20080074647 A | 8/2008 |

OTHER PUBLICATIONS

Sakui, et al., "A Compact Space and Efficient Drain Current Design for Multipillar Vertical MOSFETs," IEEE Transactions on Electron Devices, vol. 57, No. 8, Aug. 2010, pp. 1768-1773.

(Continued)

*Primary Examiner* — Howard Weiss
*Assistant Examiner* — Steven Rao
(74) *Attorney, Agent, or Firm* — Pillsbury Winthrop Shaw Pittman LLP

(57) ABSTRACT

A transistor and a method of fabricating a transistor, including a metal oxide deposited on an epitaxial layer, a photo resist deposited and patterned over the metal oxide and the metal oxide and epitaxial layer are etched to form at least one circular trench, wherein the trench surfaces are defined by the epitaxial layer. An oxide layer is grown on the trench surfaces of each trench, and a gate conductor is formed within the at least one trench.

23 Claims, 27 Drawing Sheets

(56) References Cited

OTHER PUBLICATIONS

Ludikhuize, "A Review of RESURF Technology," Power Semiconductor Devices and ICs, 2000, The 12th International Symposium on May 22-25, 2000, pp. 11-18.

"Power MOSFET Basics" available at www.aosmd.com/pdfs/appNotes/Power_MOSFET_Basics.pdf: retrieved on Mar. 11, 2011.

Byeon, et al., "The breakdown voltage of negative curvatured p+n. diodes using a SOI layer," Solid-State Electronics vol. 41, Issue 5, May 1997, pp. 787-788.

Yu, et al., "Scaling of Nanowire Transistors," IEEE Transactions on Electron Devices, vol. 55, No. 11, Nov. 2008, pp. 2846-2858.

English language translation of the Office Action issued on Jan. 22, 2013, in corresponding Japanese Patent Application No. 2010-249690.

* cited by examiner

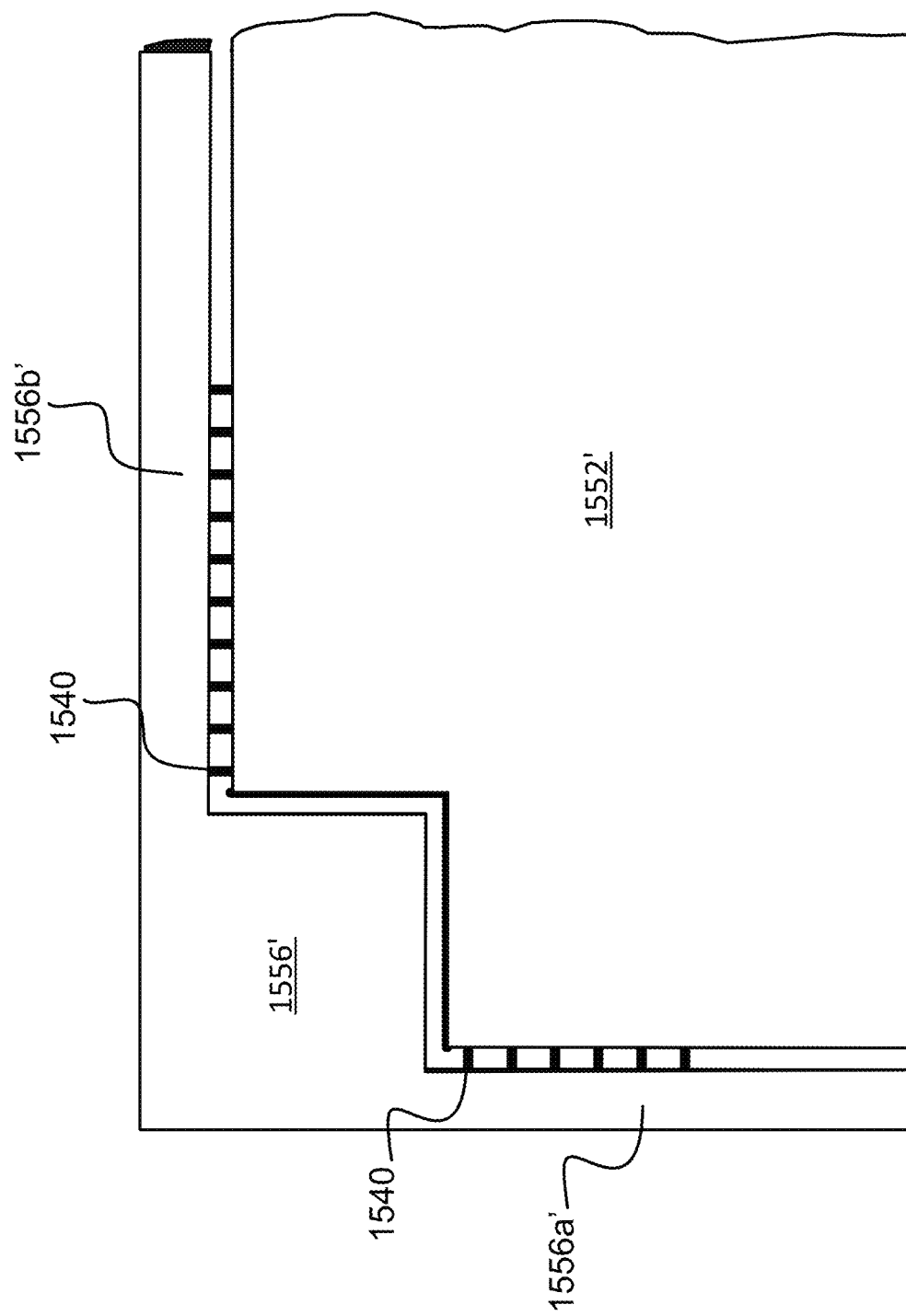

US 8,754,472 B2

METHODS FOR FABRICATING TRANSISTORS INCLUDING ONE OR MORE CIRCULAR TRENCHES

BACKGROUND

During the past few decades, there has been an increasing interest in semiconductor devices, such as power metal oxide semiconductor field effective transistors (MOSFETs) used in various applications. The power MOSFET may usually have a polysilicon layer. The polysilicon layer can be used, for example, as a gate electrode or gate runner of the power MOSFET.

The power MOSFET may have two structures, e.g., a vertical diffused MOSFET (VDMOS) and a trench MOSFET in different applications. The VDMOS became available in mid-1970 due to the availability of planar technology. By late 1980, the trench MOSFET started to penetrate power MOSFET markets utilizing DRAM trench technology, which has improved Specific On Resistance (RDSON). However, the blockage voltage or breakdown voltage of trench MOSFET may be limited to low voltage (<600 V) due to more curvatures and stress of trench MOSFET structures. Also, the electrical field density tends to be higher in trench MOSFET due to positive curvature diode doping profiles, which may reduce the breakdown voltage. Besides breakdown issues, the threshold voltage and RDSON may be limited and cannot be easily further improved with the updated new and scale down semiconductor technologies.

SUMMARY

An embodiment of the present disclosure relates to a transistor. The transistor may include an epitaxial layer and at least one trench having a circular cross-section including a trench surface defined by said epitaxial layer, a gate oxide disposed over said trench surface, and a gate conductor deposited within said trench.

Another embodiment of the present disclosure relates to a power conversion system. The power conversion system may include at least one switch, wherein the switch comprises a transistor. The transistor may include an epitaxial layer and at least one trench having a circular cross-section, wherein the trench includes a trench surface defined by the epitaxial layer, a gate oxide disposed over the trench surface, and a gate conductor deposited within the trench.

A further embodiment of the present disclosure relates to a method of fabricating a transistor. The method may include growing an epitaxial layer on a substrate, depositing an oxide on the epitaxial layer, coating a photo resist over the oxide and patterning the photo resist. The method may also include etching the oxide and epitaxial layer to form at least one circular trench, wherein the trench surfaces may be defined by the epitaxial layer, growing a second oxide layer on the trench surfaces, and forming a gate conductor within the at least one trench.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

FIG. 15c illustrates conventional MOSFET structures.

DETAILED DESCRIPTION

In the following detailed description presented herein, numerous specific details are set forth in order to provide a thorough understanding of the present invention. However, it will be recognized by one skilled in the art that the present invention may be practiced without these specific details or with equivalents thereof. In other instances, well known methods, procedures, components, and circuits have not been described in detail as not to unnecessarily obscure aspects of the present invention.

Some portions of the detailed descriptions that follow are presented in terms of procedures, logic blocks, processes, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "coating," "depositing," "etching," "fabricating," "siliciding," "implanting," "metalizing," "titanizing" or the like, refer to actions and processes of semiconductor device fabrication.

It is understood that the figures are not drawn to scale, and only portions of the structures depicted, as well as the various layers that form those structures, are shown.

Furthermore, other fabrication processes and steps may be performed along with the processes and steps discussed herein; that is, there may be a number of processes and steps before, in between and/or after the steps shown and described herein. Embodiments described herein can be implemented in conjunction with these other processes and steps without significantly perturbing them. Generally speaking, the various embodiments of the present invention can replace portions of a conventional process without significantly affecting peripheral processes and steps.

Figure 1A:
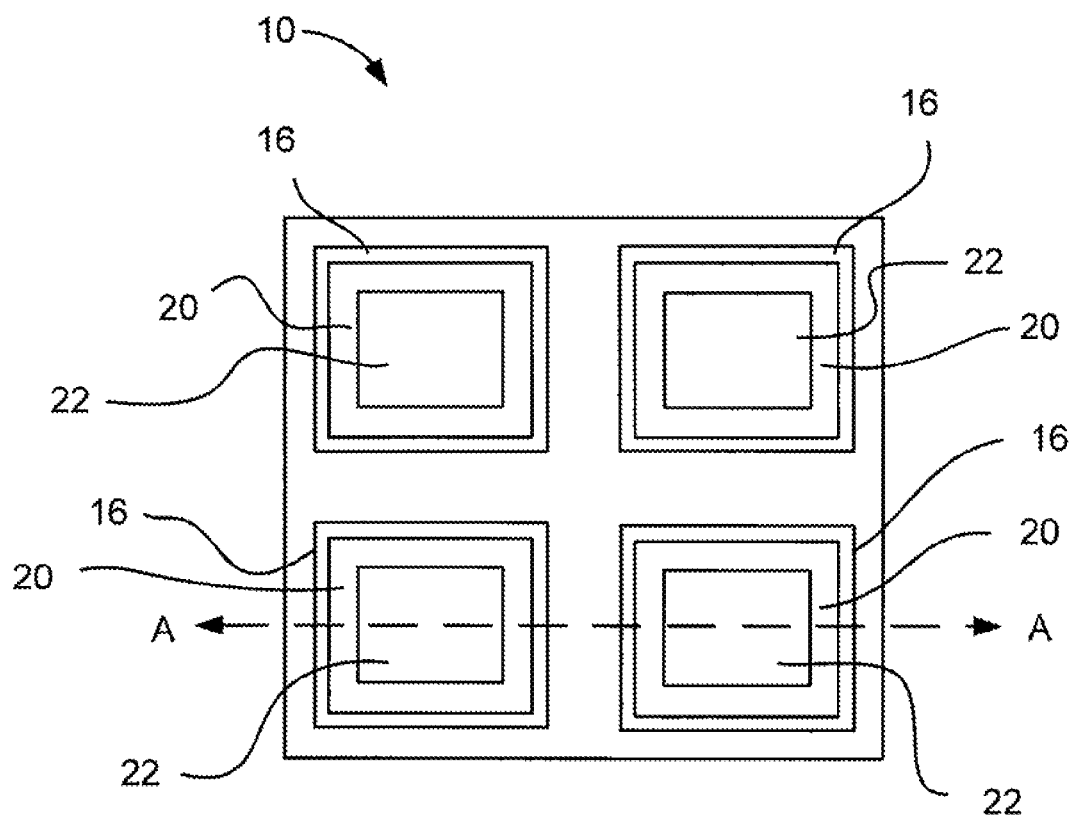
FIG. 1a illustrates a schematic top view of an embodiment of a conventional trench MOSFET.
Figure 1B:
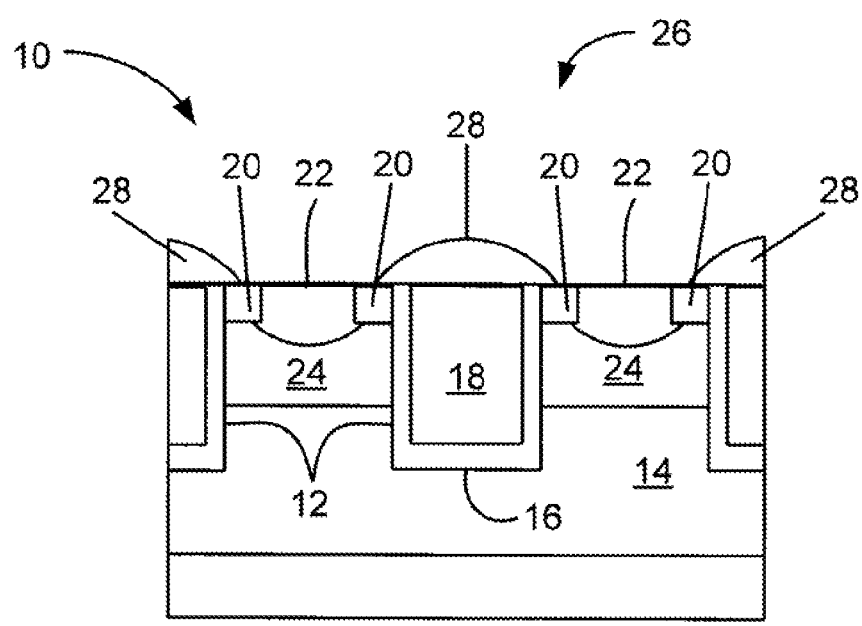
FIG. 1b illustrates a schematic cross-sectional of the trench MOSFET of FIG. 1a along A-A.

A conventional trench MOSFET (metal oxide semiconductor field effect transistor) mask may include square opening structures, a top view of which is illustrated in FIG. 1a and in the cross-sectional view of FIG. 1b. For example, the trench MOSFET 10 may include a trench 12 etched into an epitaxial layer 14 at a given depth. A gate oxide 16 and polycrystalline silicon 18 may be used to form the gate electrodes. The mesa area between trench matrixes may have square shaped plateaus on which N+ source 20 and P+ contact regions 22 are deposited or implanted. Interlayer dielectric material, metal and passivation layers may be deposited and patterned for end users.

Figure 2A:
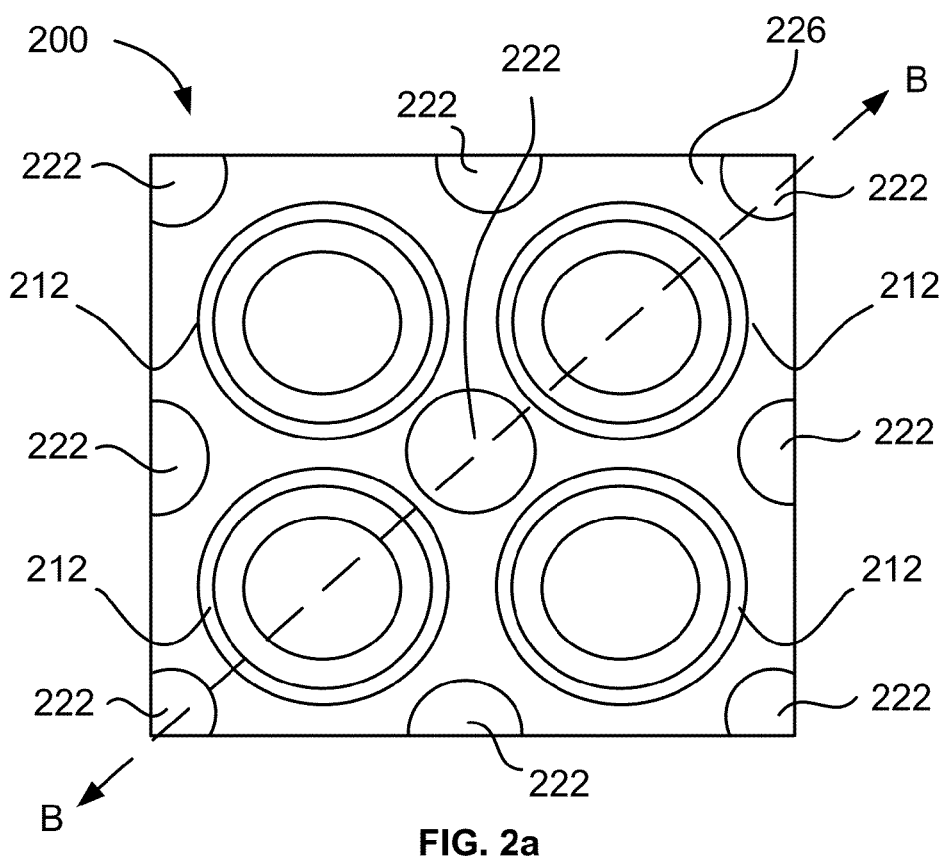
FIG. 2a illustrates a schematic top view of an embodiment of a circular trench MOSFET.
Figure 2B:
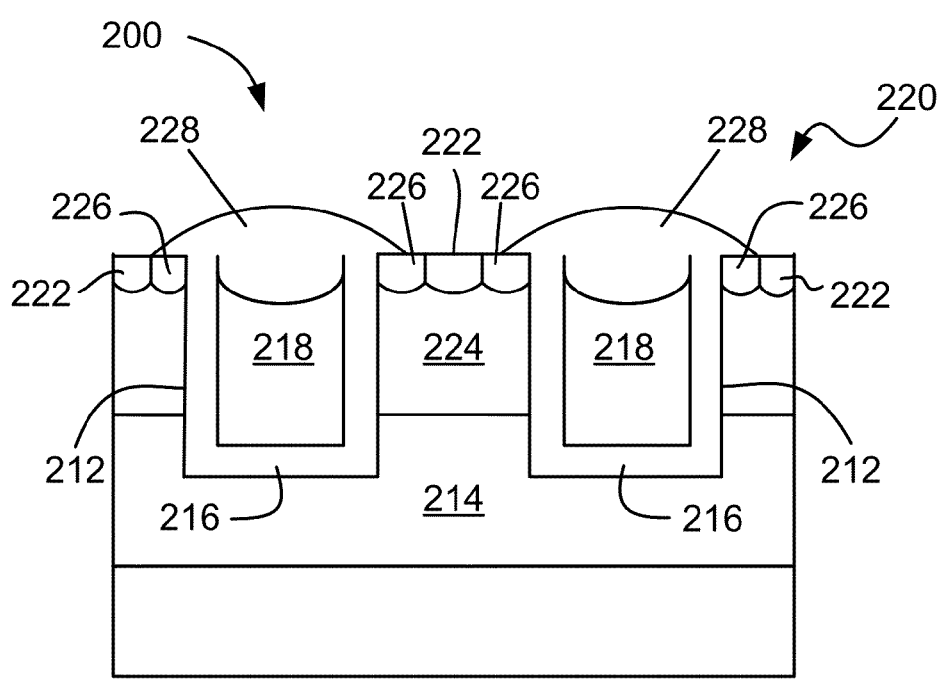
FIG. 2b illustrates a schematic cross-sectional view of the circular MOSFET of FIG. 2a along B-B.

In one embodiment, the present disclosure provides a MOSFET including circular trench openings forming the gate trenches, wherein several trench MOSFETs may share one P+ contact opening. FIG. 2 illustrates a top view of an embodiment of a trench MOSFET 200 including four trenches, wherein the trenches 212 share one P+ contact opening 222. More or less trenches may be present relative to a single P+ contact 222. In some embodiments, the number of trench transistors and the number of contacts may be present in the range of 1:1 to 6:1, including 4:1, or 5:1, depending on the uninterrupted switching (UIS)/avalanche current requirements. Regions 226 of the upper portion 220 of the MOSFET 200 may be implanted with N+ type dopants, which may partially or completely surround the P+ contact openings 222 and/or trenches 212. The trenches 212 are circular in cross-section, meaning that upon viewing the trenches 212 from the top or the upper portion 220, the trenches appear circular in nature.

FIGS. 3 through 8 illustrate one embodiment of a fabrication sequence of a circular trench metal oxide semiconductor field effect transistor (MOSFET) in accordance with one embodiment of this disclosure. The fabrication sequence of the circular trench MOSFET in FIGS. 3 through 8 is for illustrative purposes and is not intended to be limiting.

Figure 3:
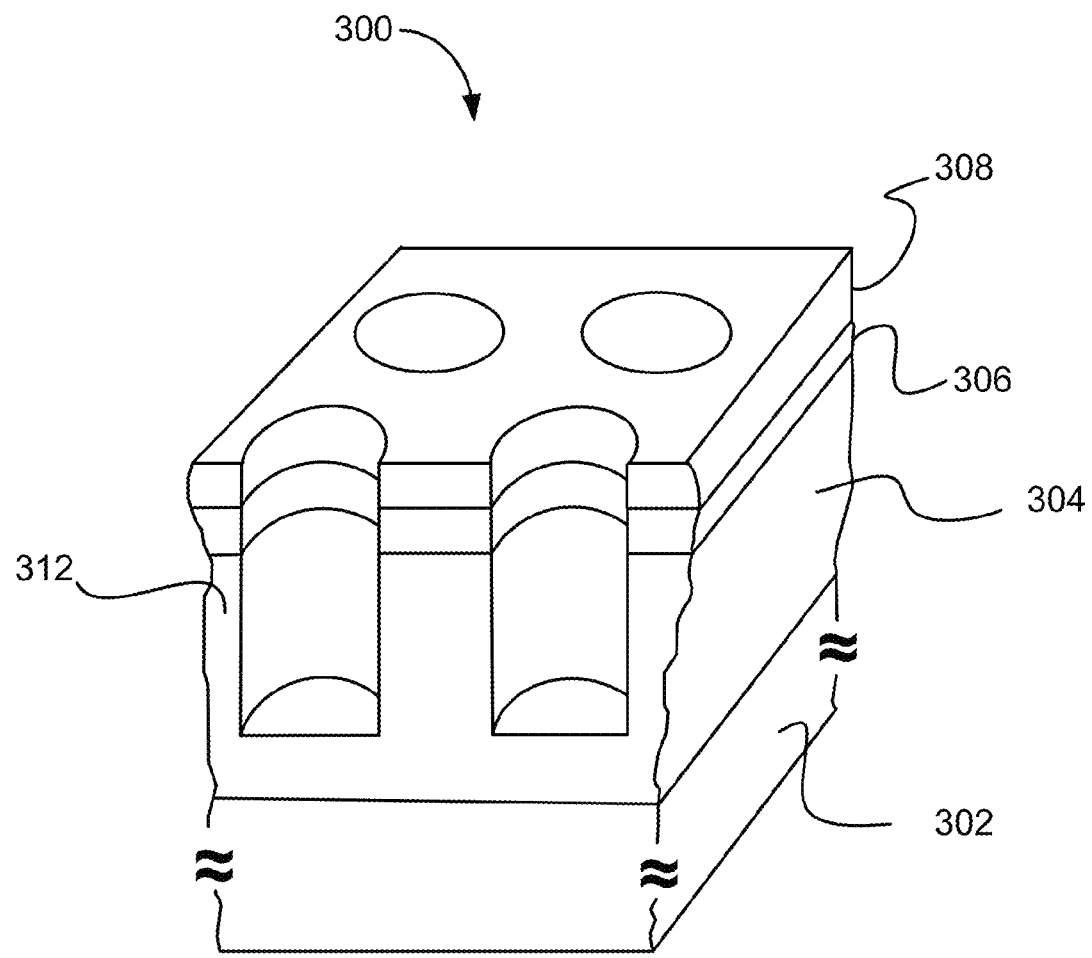
FIG. 3 illustrates an embodiment of a wafer including an epitaxial layer positioned on a substrate, an oxide layer coated on a surface of the epitaxial layer opposite the substrate, and a photo resist deposited over the oxide layer.

In FIG. 3, an epitaxial layer 304 may be grown on a semiconductor substrate 302, e.g., an N-type heavily doped (N+) substrate, of the MOSFET 300. The N-type doping may include, for example arsenic or red phosphorous. A relatively hard mask oxide 306 may be grown on the epitaxial layer 304. The hard mask oxide may include, for example, thermal $SiO_2$ or Low Temperature Oxide. The relatively hard mask oxide may be harder than the hardness of the photo resist. The hard oxide mask 306 may be patterned, wherein a photo resist 308 may then be coated over the hard oxide mask 306 and selectively cured or removed using photo lithography. The oxide mask 306 and the epitaxial layer 304 may then be etched, removing a portion of the oxide mask 306 and epitaxial layer 304 to define or form trenches 312 within the epitaxial layer 304 and the oxide layer 306. The cross-sectional area of each trench may be circular in shape. Therefore, upon viewing the trenches from the "top" of the MOSFET 300, the trenches define a circular geometry. Etching may be performed using processes such as lithography or plasma etching. In addition, the chemical plasma used to etch the oxide mask 306 may be different from the chemical plasma for the epitaxial layer 304. After etching, the photo resist 308 may then be stripped away and the wafer 300 may be cleaned and dried.

Figure 4:
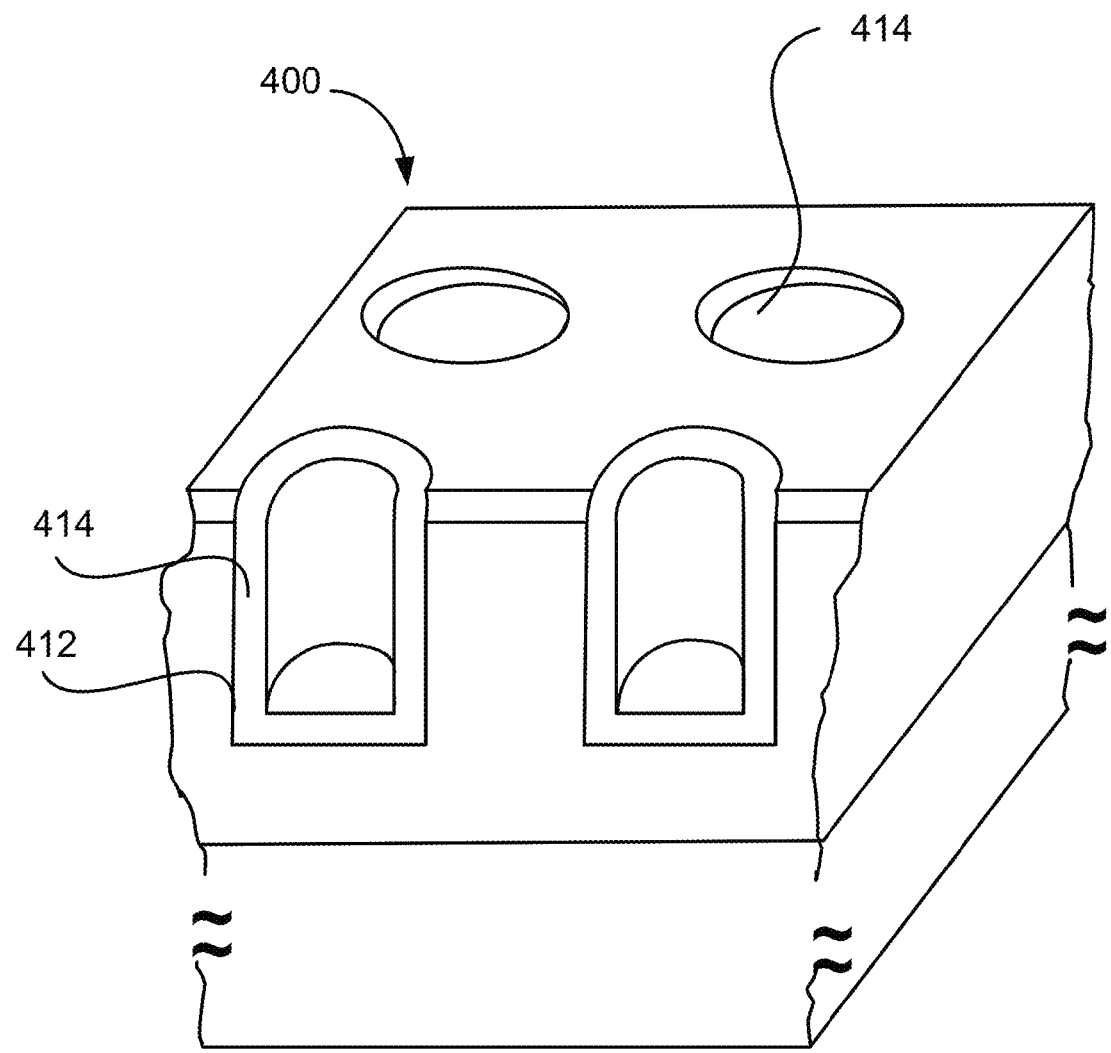
FIG. 4 illustrates a sacrificial oxide, which may be etched away before next step, grown mainly in the side walls of trench of FIG. 3.
Figure 5:
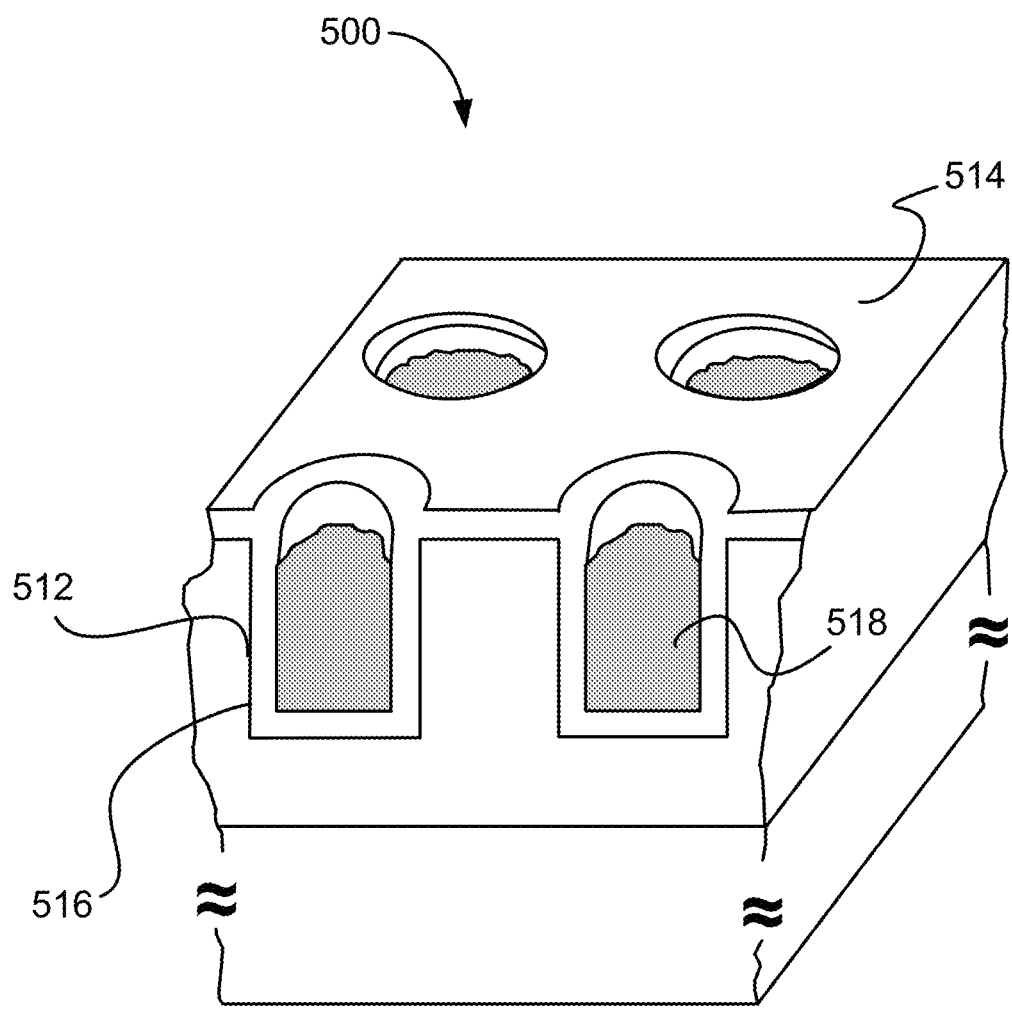
FIG. 5 illustrates an embodiment, wherein a gate oxide is grown on the trench surfaces, which may then be filled with a gate conductor.

As illustrated in FIG. 4, a sacrificial oxide 414 may be grown in the inter-surfaces of the oxide mask 406 and silicon mesa as well as the side walls of trenches 412. In some embodiments, the sacrificial oxide may include silicon oxide. The sacrificial oxide 414 may then be etched, for example, by buffered oxide etchant (BOE). In FIG. 5, gate oxide 516 may be grown in the trenches 512 on the trench surfaces defined by the epitaxial layer. In some examples, the gate oxide 516 may be thermally grown after sacrificial oxide is etched. A gate conductor material such as, for example, polysilicon, tungsten, germanium, gallium nitride (GaN), or silicon carbide (SiC), may be deposited forming a gate conductor 518 within the trench. The gate conductor 518 may be etched to the end point of the mesa oxide 516, that is, etching off the gat materials may be ended once the top surface of the mesa oxide is reached. Additional etching of the gate conductor 518 may occur over time forming a recess in the trench 512.

Figure 6:
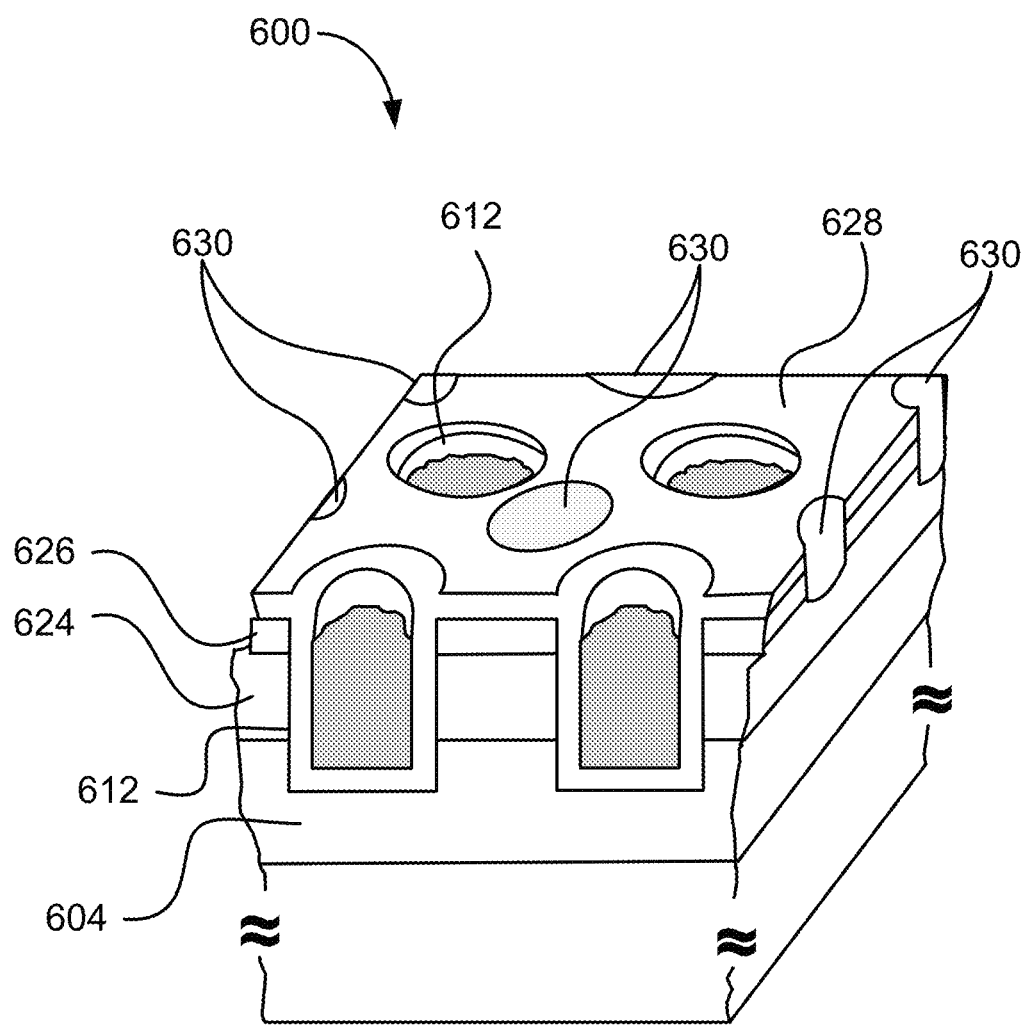
FIG. 6 illustrates an embodiment wherein the epitaxial layer includes a P− well, N+ source and P+ contact implant for P-Well layer are provided in the epitaxial layer.

In FIG. 6, a P-well 624 may be formed around the trenches 612, wherein the configuration of the P-well may depend on the termination process design. The P-well may be formed by implanting one or more P-type dopants, such as boron, and driving the P-type dopants into the epitaxial layer 604 to a given depth or range of depths under the surface of the epitaxial layer 604. This may be followed by annealing, which may be facilitated in a furnace. A patterned photo resist layer may be applied and N+ type dopants are implanted according to the patterned photo resist into the epitaxial layer to form an N+ layer 626, followed by annealing. The N+ type dopant may include, for example, arsenic. The N+ layer 626 may be formed over the P-well 624 near the upper surface of the epitaxial layer 604. The photo resist may then be then stripped and low temperature oxide (LTO) and boron-phosphorus-silicate glass (BPSG) may be deposited to form a layer 628 over the N+ doped portion 626 of the epitaxial layer 604. In one embodiment, the BPSG may be deposited after depositing the LTO. The low temperature oxide may be, for example, silicon oxide. The BGSP/LTO surface may be patterned and P-type dopants, such as boron, may be implanted into epitaxial layer 604 and annealed forming a P+ contacts 630.

Figure 7:
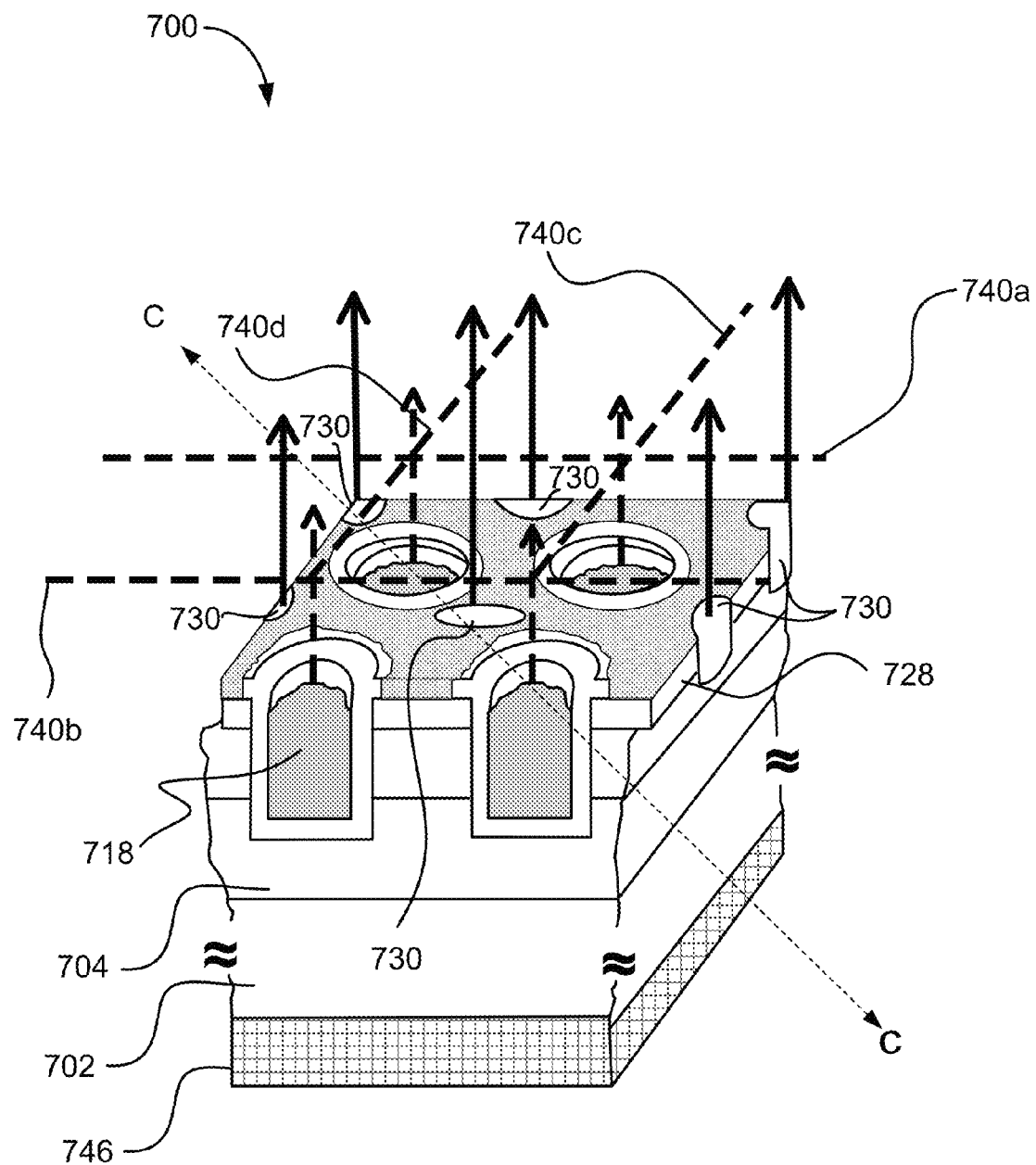
FIG. 7 illustrates an embodiment of a wafer including a low temperature oxide and boron-phosphorus-silicate glass (BPSG) deposited over the epitaxial layer. After contact windows are patterned, bi-metal layers including W-plug and interlayer (ILD) are performed which is shown by schematic diagram only.

In FIG. 7 through 9 illustrate front bi-metal system layers. In FIG. 7, the front bi-metal system layers including W-plug, first metal, interlayer dielectric (ILD) and top metal deposited over the low temperature oxide and boron-phosphorus-silicate glass 728 are schematically illustrated. The bi-metal system layers may include a first metal for forming gate electrodes, which may include gate runners 740a, 740b, 740c, 740d connecting the gate conductors 718 to gate pads (not illustrated). The bi-metal system layers also include a top metal for connecting the P+ contacts 730 to a source pad (not illustrated). A drain metal 746 may also be applied to a surface of the substrate 702 opposing the epitaxial layer 704. Non-limiting examples of drain metals may include titanium, nickel, gold or alloys thereof.

Figure 8A:
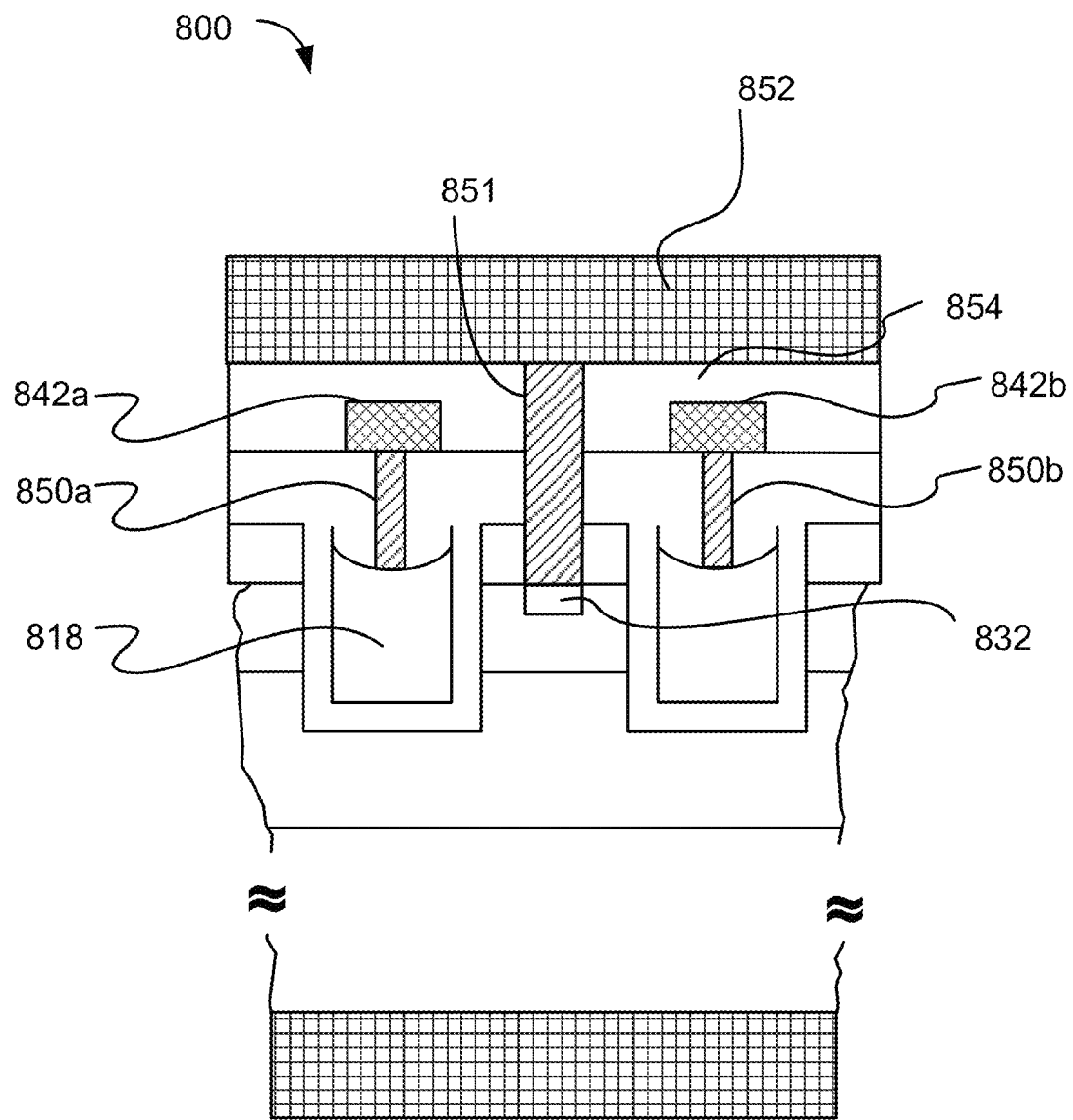
FIGS. 8a and 8b illustrate cross-sectional views of embodiments of the MOSFET of FIG. 7 along line C-C including tungsten plugs, gate electrodes and a source electrode.
Figure 8B:
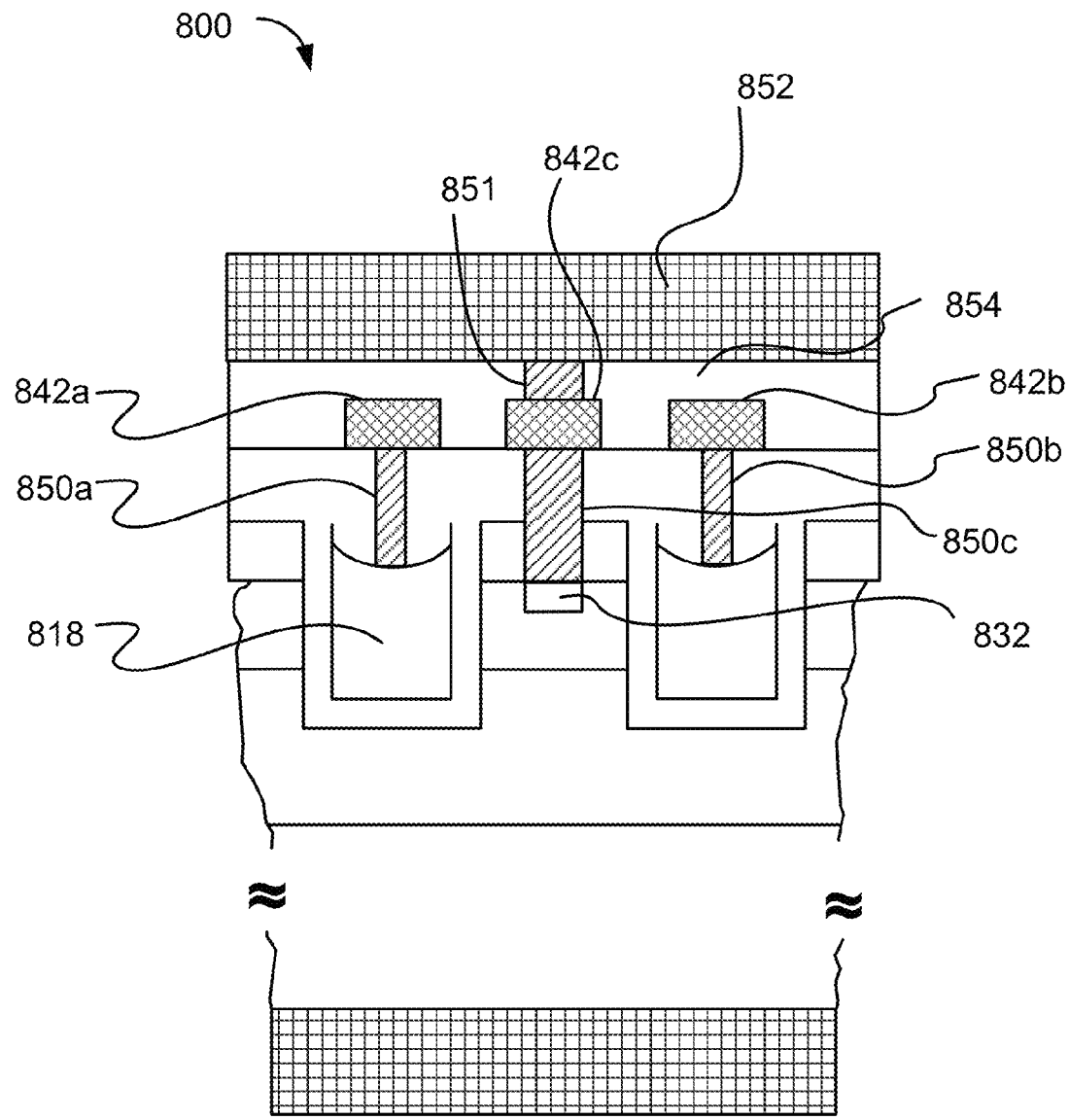

FIG. 8a and FIG. 8b illustrate cross-sectional views of embodiments of a MOSFET 800 taken across line C-C of FIG. 7. In FIG. 8a tungsten plug technology may be used to deposit tungsten and chemical mechanical polish (CMP) tungsten to form plugs 850a, 850b, 851 connecting the gate conductor 818 to the gate runners 842a, 842b and the P+ contact 832 to the source pad 852. That is, contact holes may be etched and tungsten may then be deposited in the holes forming the tungsten plugs. This may be followed with tungsten chemical-mechanical planarization wherein abrasive slurry is provided and a polishing pad is used to remove excess tungsten. The first metal for the gate runners 842a, 842b is then deposited.

In FIG. 8b tungsten plug technology may be used to deposit tungsten and chemical mechanical polish (CMP) tungsten to form plugs 850a, 850b, 850c connecting the gate conductor 818 to the gate runners 842a, 842b and the P+ contact 832 to the gate runner 842c. The gate runner 842c may, in turn, be connected the source pad 852 via plug 851 also formed using tungsten plug technology.

After depositing the first metal, in the embodiments of FIGS. 8a and 8b, an interlayer dielectric material 854 may be deposited and patterned. The top metal layer may then be deposited and patterned forming the source electrode or source pad 852. Finally, a passivation layer may be deposited and patterned on the gate source areas, ending the front side process. Then the wafers may be ground to certain thickness in order to reduce RDSON and improve heat dissipation. After that, back metal layers may be sputtered, which may complete the fabrication process for the trench MOSFET.

Figure 9A:
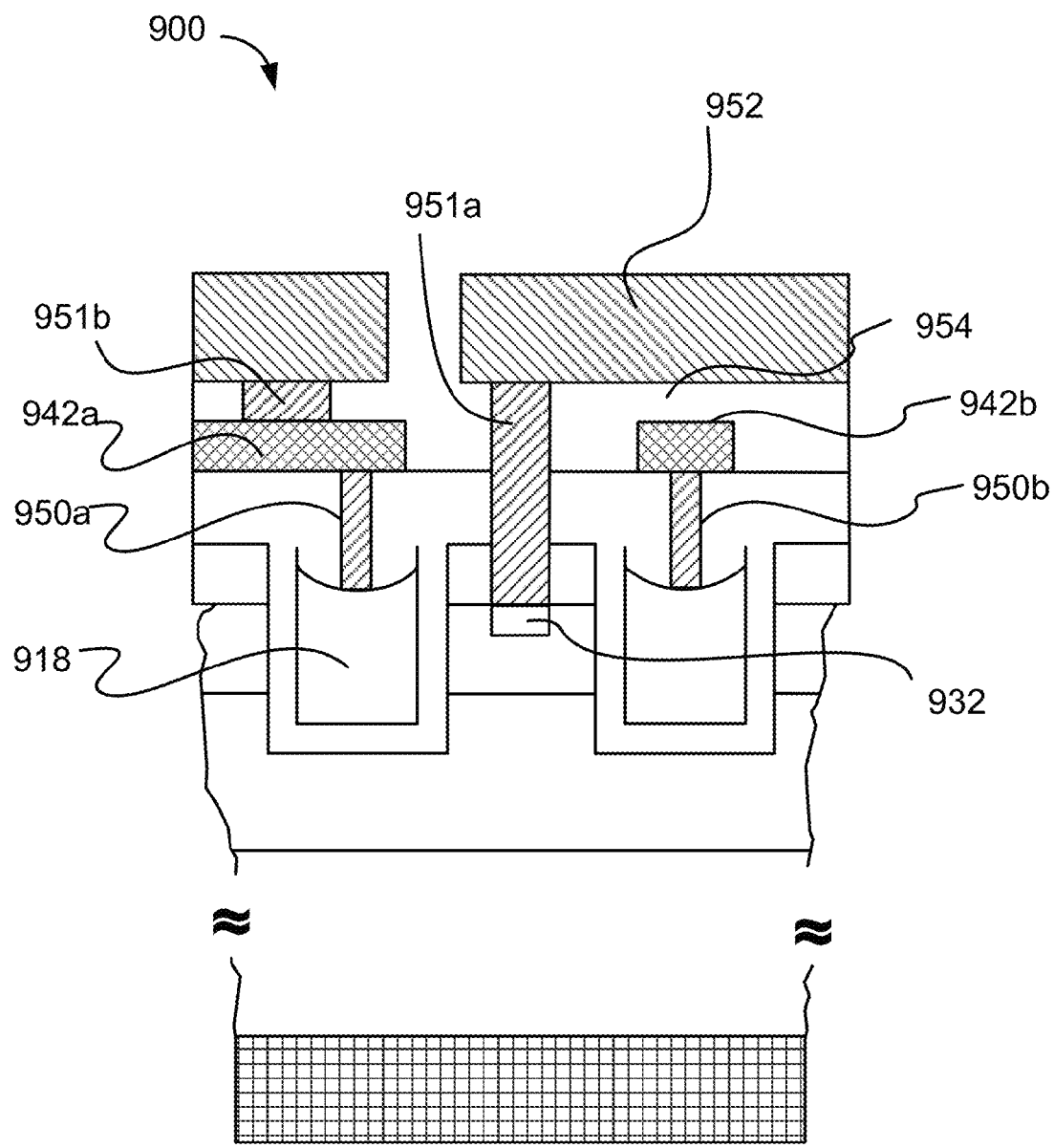
FIGS. 9a and 9b illustrate additional cross-sectional views of embodiments of the MOSFET of FIG. 7 along line C-C near the gate pad.
Figure 9B:
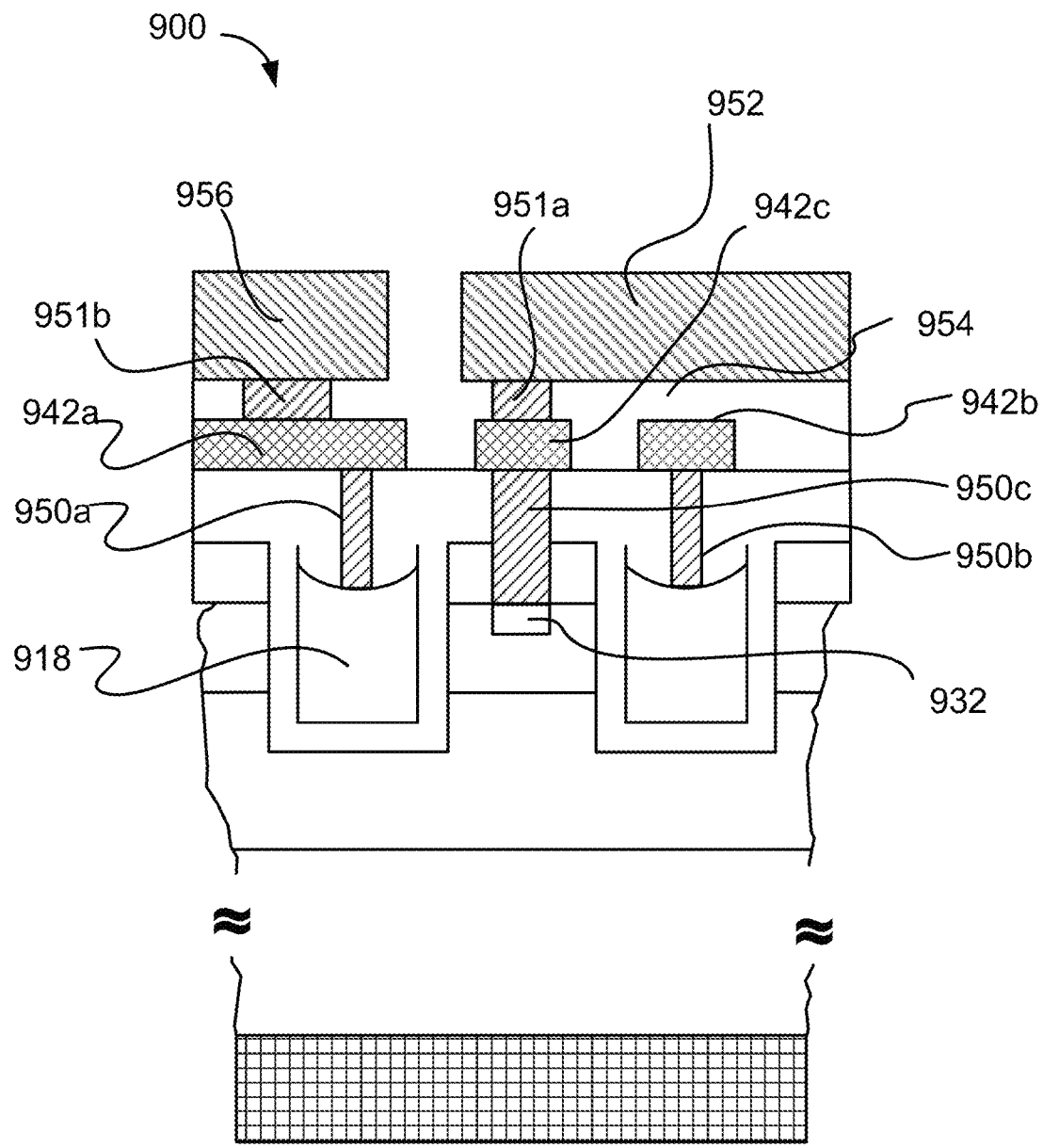

FIGS. 9a and 9b illustrate cross-sectional views of embodiments of a MOSFET 900 near the gate pad region taken along line C-C of FIG. 7. Again, as illustrated in FIG. 9a, tungsten plug technology, as described above, may be used to deposit tungsten plugs 950a, 950b connecting the gate conductor 918 to the gate runners 942a, 942b. In addition, tungsten plug technology may be used to deposit tungsten plug 951a and connecting the P+ contact 932 to the source pad 952. This may be followed with tungsten chemical-mechanical planarization. The first metal for the gate runners 942a, 942b may then be deposited. An additional tungsten plug may be deposited 951b connecting the gate runners 942a to the gate pad 956. The gate runners and gate pads may be partially or completely interconnected.

As illustrated in FIG. 9b, tungsten plug technology, as described above, may be used to deposit tungsten plugs 950a, 950b connecting the gate conductor 918 to the gate runners 942a, 942b and tungsten plug 950c connecting the P+ contact 932 to gate runner 942c. This may be followed with tungsten chemical-mechanical planarization. The first metal for the gate runners 942a, 942b, 942c may then be deposited. An additional tungsten plug 951a may be deposited connecting the gate runner 942c with the source pad 952 and a tungsten plug 951b may be deposited connecting gate runner 942a to the gate pad 956. The gate runners 942a, 942b and gate pads may be partially or completely interconnected.

After depositing the first metal, an interlayer dielectric material 954 may be deposited and patterned. A gate pad 956 may then be deposited and a top metal layer may be deposited and patterned forming the source electrode or source pad 952. Finally, a passivation layer may be deposited and patterned. The passivation layer may include, for example, low temperature oxide, nitride or combinations thereof. Patterning may depend upon application to end the front side processes. The wafers may then be ground to certain thickness in order to reduce RDSON and improve heat dissipation. After, the back metal layers may be sputtered completing the fabrication process for the trench MOSFET.

FIGS. 10 through 15b illustrate cross-sectional perspective views of a fabrication sequence of a circular trench metal oxide semiconductor field effect transistor (MOSFET) in accordance with another embodiment. The fabrication sequence of the circular trench MOSFET in FIGS. 10 through 15b is for illustrative purposes and is not intended to be limiting.

Figure 10:
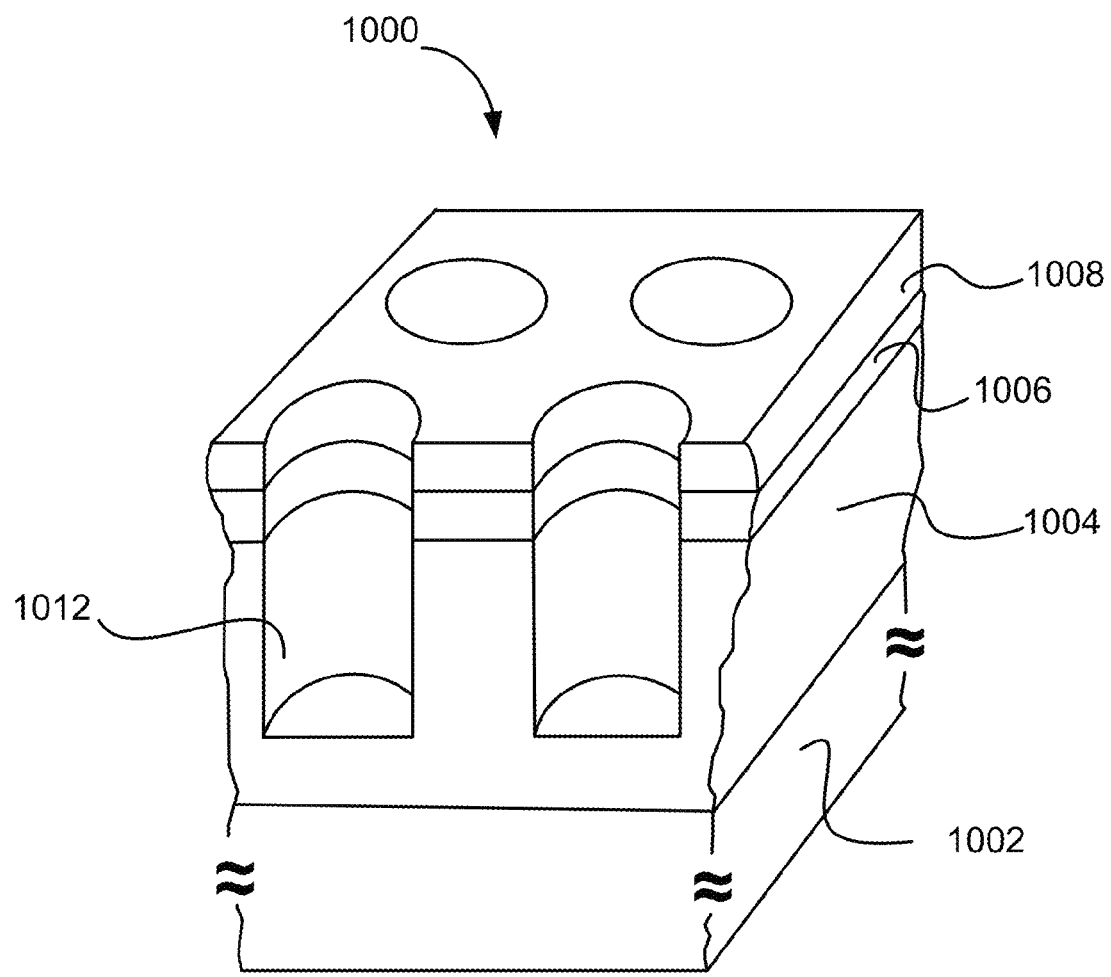
FIG. 10 illustrates a further embodiment, wherein an epitaxial layer is formed over a substrate and a thicker oxide mask and photo resist are coated over the epitaxial layer opposite the substrate. In addition, trenches are etched into the epitaxial layer and oxide mask.

In FIG. 10, a relatively thick hard mask oxide 1006 may be grown onto an epitaxial layer 1004 formed over an N+ doped substrate wafer 1002. The mask oxide thickness may be 5,000 Angstroms or greater. Again, the N+ dopant may include, for example, arsenic or red phosphorous. A photo resist 1008 may be coated on the mask oxide 1006 and patterned with a trench mask. The mask oxide 1006 and epitaxial layer 1004 may be etched forming circular trenches 1012 therein. Different chemical plasmas may be used to etch each layer. The photo resist may then be stripped and the wafer 1000 may be cleaned and dried.

Figure 11:
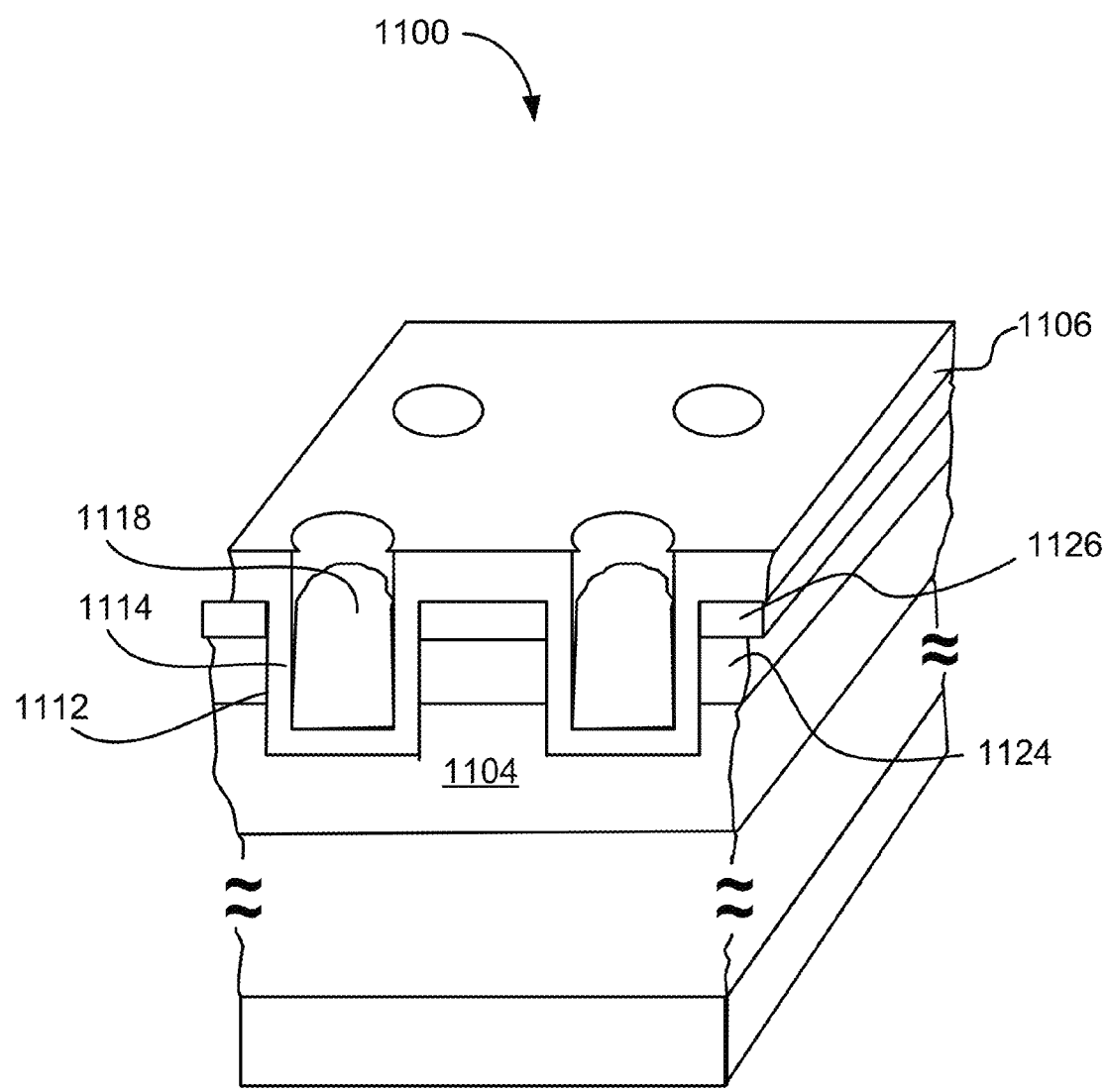
FIG. 11 illustrates a gate oxide grown on trench surfaces after sacrificial oxide growth/etch and a gate conductor deposited and etched back within the trenches over the gate oxide as well as P-Well implant and anneal.

In FIG. 11, a sacrificial oxide layer may be grown and etched using buffered oxide etchant, which may remove surface defects. A portion of the relatively thick hard oxide mask 1106 may remain at the top of the mesa area to provide electrical isolation between the gate conductors and epitaxial layer. Gate oxide 1114 may then be thermally grown within the trenches. Gate conductor material, such as polysilicon, may be deposited and etched back in the trenches 1112 forming gate conductors 1118.

A P-well 1124 may be formed around the trenches 1112, the configuration depending on the application. The P-well may be formed by implanting one or more P-type dopants, such as boron, and driving the P-type dopants into the epitaxial layer 1104 to a given depth under the surface of the epitaxial layer 1104. This may be followed by annealing, which may be facilitated in a furnace. A patterned photo resist layer may be applied and N+ type dopants may be implanted according to the patterned photo resist into the epitaxial layer to form an N+ layer 1126 followed by annealing. A non-limiting example of an N+ type dopant may include arsenic. The N+ layer may include arsenic and may be formed over the P-well 1124 near the upper surface of the epitaxial layer 1104.

Figure 12:
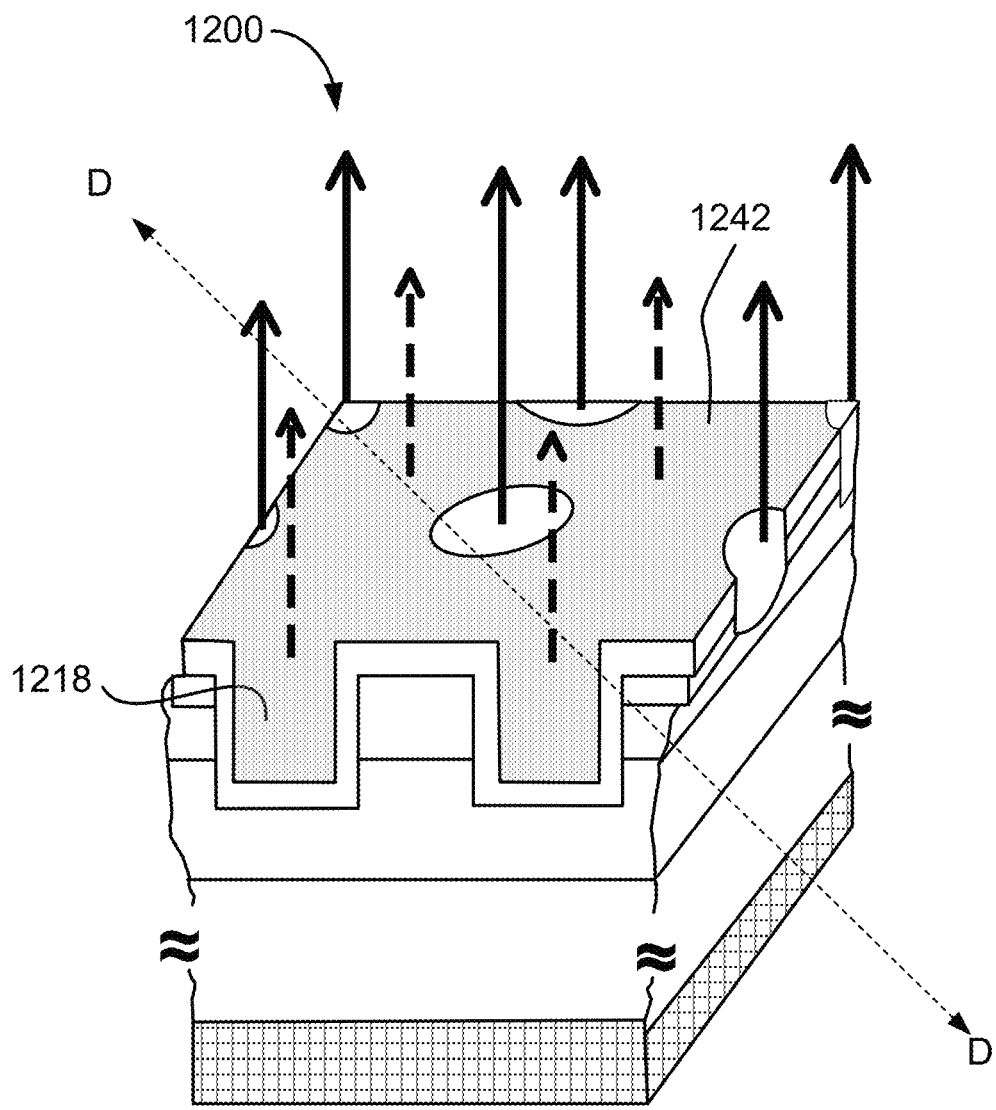
FIG. 12 illustrates second gate electrodes patterned connecting the gate conductors together formed over the mask oxide and etched. After that, P-Well, N+ Source and contact implant/anneal may performed. The LTO/BPSG may deposited and patterned for single metal sputtering and patterning including W-plug (not illustrated).

In FIG. 12, a second gate conductor material, such as polysilicon, may be deposited, patterned by lithography and etched with plasma to form a runner 1242 over the mesa area connecting the gate conductors 1218 together. The first gate conductor material (forming the gate conductor) and the second gate conductor material (forming the runners) may be the same or similar materials in some embodiments. In other embodiments, the first and second gate conductor materials may be different. After, P-Well, N+Source, and contact implant and/or anneal may be performed. The low temperature oxide (LTO) and boron phosphorus silicate glass (BPSG) may be deposited and patterned for single metal sputtering and patterning including W-Plug, which is illustrated schematically.

Figure 13:
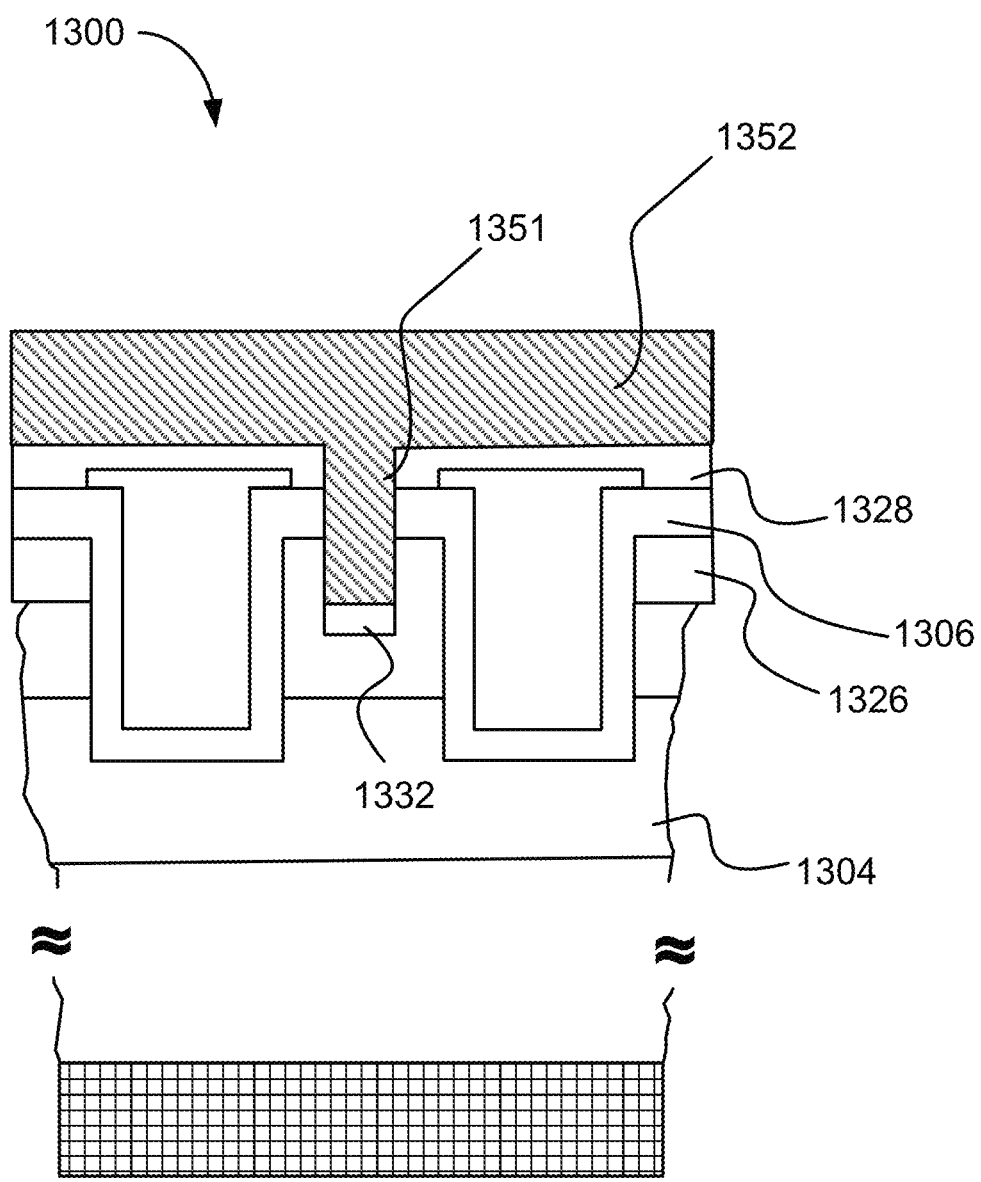
FIG. 13 illustrates a cross-sectional view of FIG. 12 along line D-D including tungsten plugs and a source electrode.

FIG. 13, which is a cross-section of FIG. 12 taken at the dotted line D-D, illustrates that low temperature oxide (LTO) and boron-phosphorus-silicate glass (BPSG) may be deposited to form a layer 1328 over the N+ doped portion 1326 of the epitaxial layer 1304. In some embodiments, the LTO may be deposited first and then the BPSG may be deposited over the LTO. The low temperature oxide may be, for example, silicon oxide. Then P-type dopants, such as boron, may be implanted into the oxide mask 1306 and the epitaxial layer 1304 and annealed to form a P+ contact 1332. Such arrangement may lead to improved breakdown voltage. After contact patterning, tungsten plug technology may be used to deposit tungsten plugs 1351, which may be followed by chemical mechanical planarization. A source pad may then be deposited 1352 over the low temperature oxide and boro-phosphosilicate glass 1328.

Figure 14:
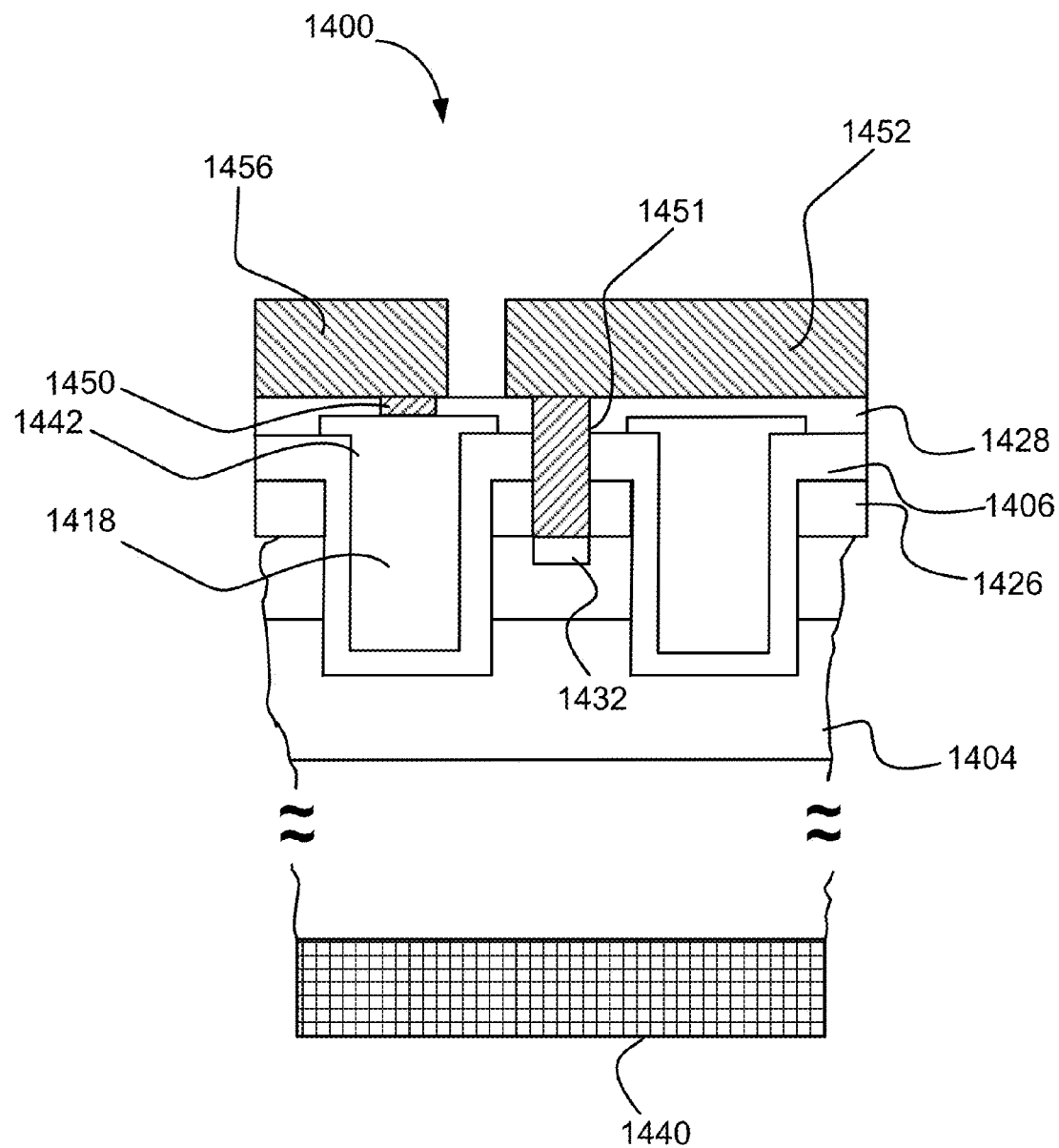
FIG. 14 illustrates a cross-sectional view of FIG. 12 along line D-D including a gate pad.

FIG. 14 illustrates a cross-sectional view of the MOSFET near the gate pad region taken along dotted line D-D of FIG. 12. As illustrated, an additional tungsten plug 1450 may be provided to connect the gate conductor 1418 to the gate pad 1456 through gate runners formed by the second gate conductor material 1442. In addition, tungsten plug 1451 may be provided to connect the P+ contact 1432 with the source pad 1452. The various gate conductors 1418 on the MOSFET 1400 may be wholly or partially interconnected. Front metal layers may be deposited and patterned. In one embodiment, a first metal for the gate pad 1456 and a second metal for the source pad 1452. A passivation layer may be deposited over the source pad and gate pad and patterned followed by wafer grinding and back metallization may be performed to form the drain 1440.

Figure 15A:
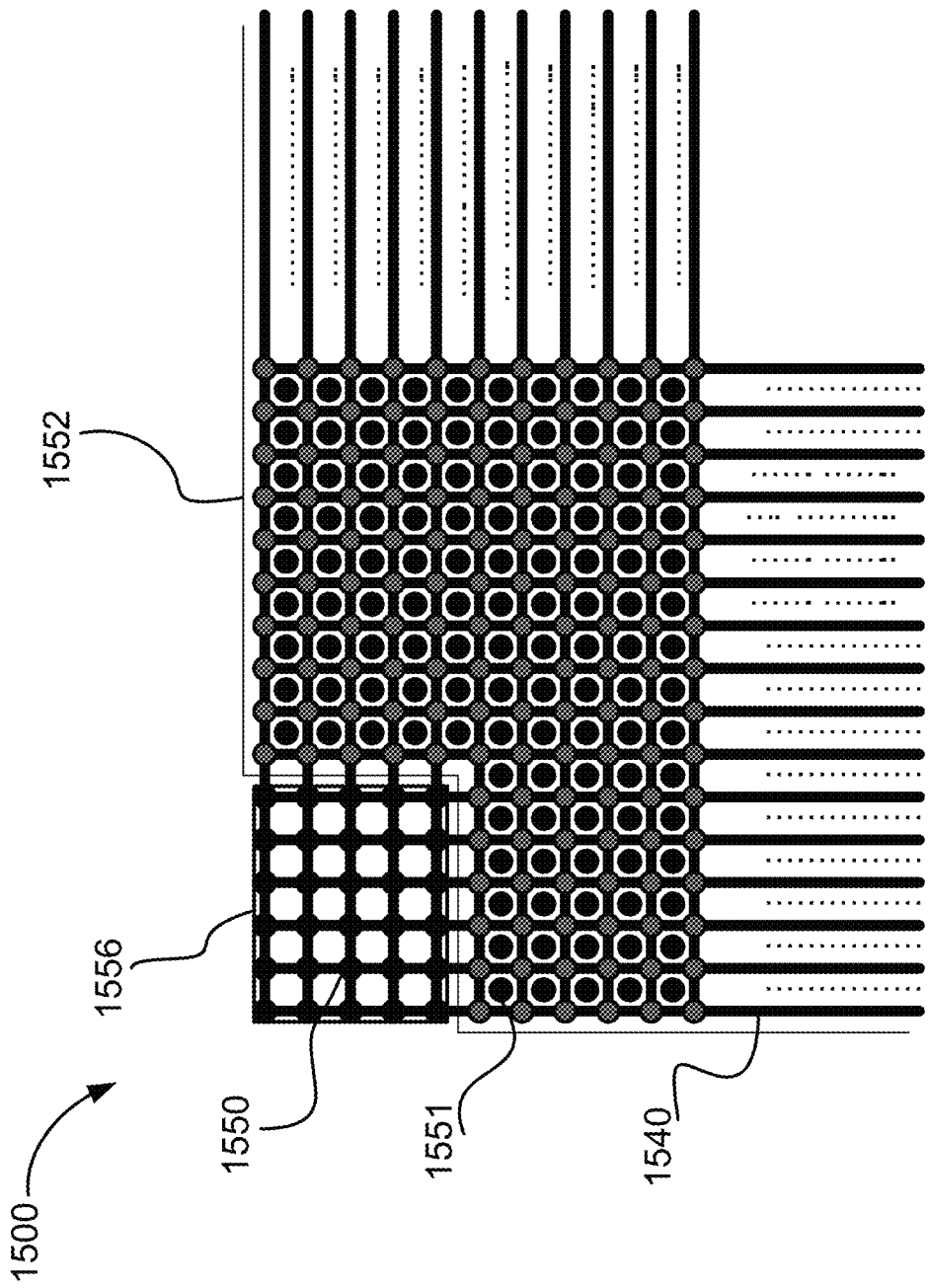
FIG. 15a illustrates a schematic top view of an embodiment of a MOSFET after tungsten plug addition.
Figure 15B:
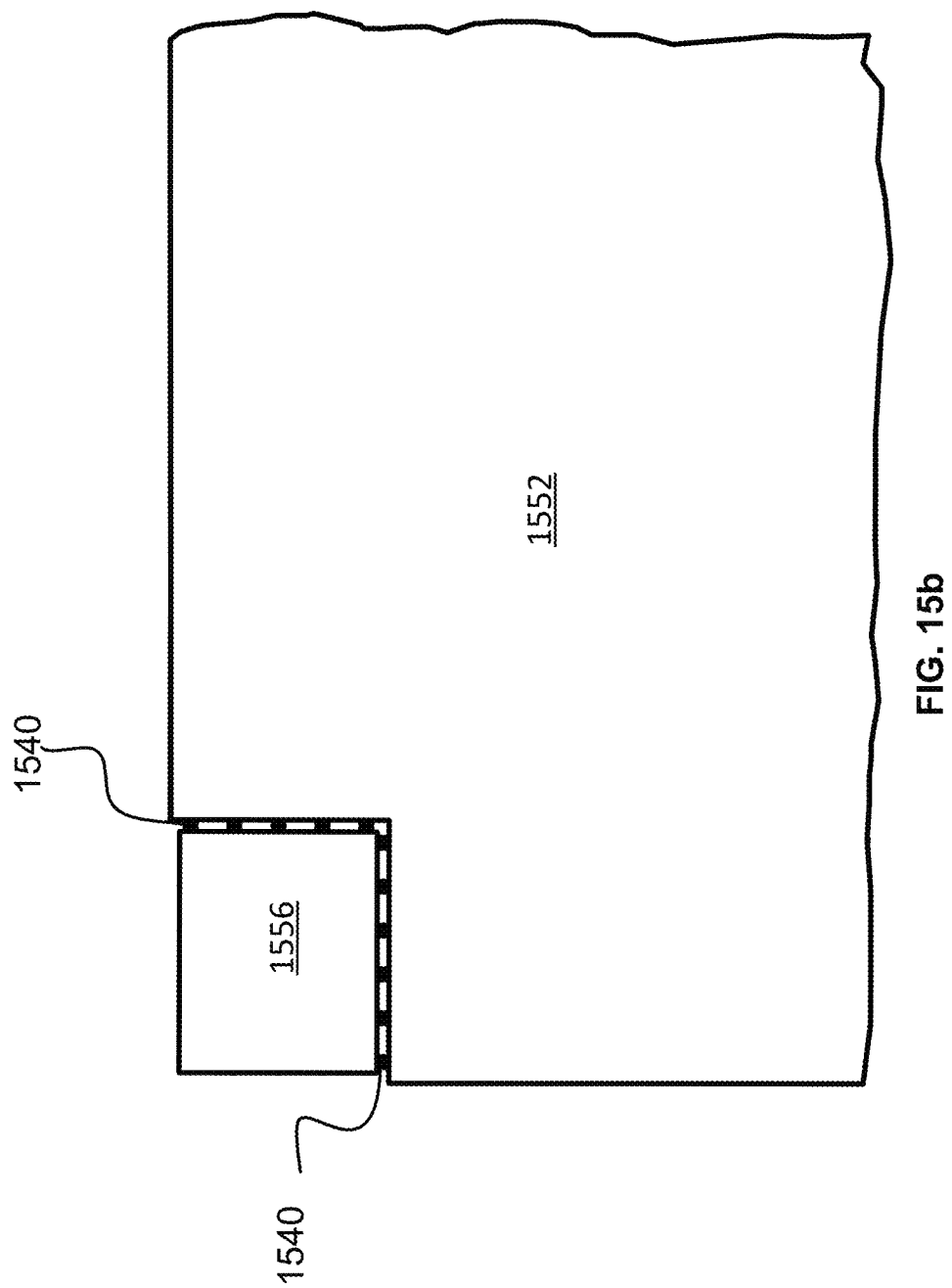
FIG. 15b illustrates a schematic top view of an embodiment of a MOSFET after metallization patterning.

FIG. 15a illustrates a top view the MOSFET 1500 after the tungsten plug addition step. The tungsten plugs 1550 for the gate and the tungsten plugs for the source 1551 are illustrated and a number of gate runners 1540 are provided. The outlined portions illustrate the gate pad peripheral 1556 and the source pad peripheral 1552 locations after metallization patterning. FIG. 15b illustrates a top view of the MOSFET 1500 after metallization patterning of the source pad 1552 and the gate pad 1556. FIG. 15c illustrates the conventional source pad 1552' and gate pad 1556' technology. As can be seen, in FIG. 15c, a conventional gate pad 1556' requires the addition of gate pad runners 1556a' and 1556b'. The embodiment described in FIGS. 10-15b may eliminate the need for such runners, cutting down on the total amount of space the gate pad 1556 requires and the amount of material necessary to provide the gate pad 1556.

In some embodiments, the circular trench MOSFETs may provide for easier incorporation of trench bottom oxides. In other embodiments, the circular trench MOSFETs with high electron mobility transistors (HEMT) may provide easier fabrication with compounds such as SiC and GaN.

Circular trench MOSFETs may also provide the following additional benefits. Unlike nano-wire or multi-pillar vertical transistors, the circular boundaries may provide a uniform and outwardly irradiative electrical field line density, which does not have localized electrical field crowding that may trigger premature voltage breakdown. The circular boundaries may also provide less stress along the side walls and trench bottom corners reducing localized stresses that may also trigger premature voltage breakdown. Thus, the breakdown voltage may be higher in circular trench MOSFETs. In addition, with proper reduced surface (RESURF) termination and negative curve doping (NCD), the breakdown voltage may go up to 1,000 V or more.

Another potential benefit includes the elimination of gate runners around the outside of the peripheral of core chips/dies present in conventional trench MOSFET design. The gate pad may be connected directly onto the gate through gate electrodes formed, for example, of metal or polycrystalline silicon. The direct contact of the gate may provide higher packing density to provide more chips/dies out per wafer.

A further potential benefit includes lower threshold voltages compared to conventional square trench MOSFET as the electrical field lines of the circular trench MOSFET radiate outward from the gate cylinder center. The RDSON may be reduced further due to lower threshold voltage.

In addition, the relatively wider trench openings and circular shape may lead to etching the trench depth in a uniform manner relatively easily with little plasma loading effect due to wider trench openings and circular shape. The wider trench openings and circular shape may also lead to easily oxidizing in a uniform manner the trench bottom forming trench bottom oxide (TBO). The wider trench openings and circular shape may further lead to use of all semiconductor materials such as Si, Ge, GaN, SiC and so on to make the trench MOSFET or high electron mobility transistor (HEMT) relatively easily.

The fabrication sequence disclosed in FIGS. 3 through 8 may utilize an extra metal mask and interlayer dielectric material for the due metal system compared to other systems. In addition, the fabrication sequence disclosed in FIGS. 9 through 13 may require an extra polysilicon mask compared to other systems. It is possible that these additional layers may increase costs; however, the increase in cost may be compensated by the relatively higher voltage breakdown capability and relatively lower RDSON performance.

Figure 16:
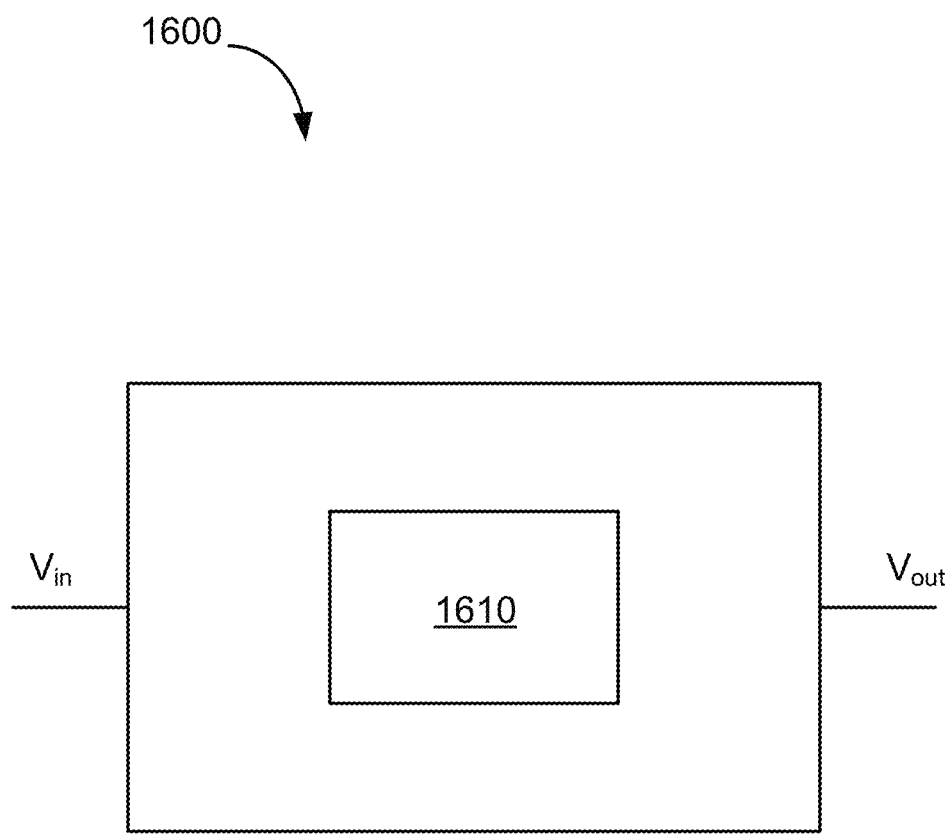
FIG. 16 illustrates an embodiment of a power conversion system.

FIG. 16 illustrates a diagram of a power conversion system 1600 in accordance with one embodiment. The power conversion system 1600 can convert an input voltage to an output voltage. The power conversion system 1600 can be direct current to direct current (DC-DC) converter, an alternating current to direct current (AC-DC) converter, or a DC-AC converter. The power conversion system 1600 can include one or more switches 1610. In one embodiment, the switch 1610 may be, but is not limited to, a circular trench MOSFET (e.g., 800 in FIG. 8 or 1300 in FIG. 13) fabricated by the manufacturing process and steps shown in FIGS. 3 through 9 or FIGS. 10 through 14.

Figure 17:
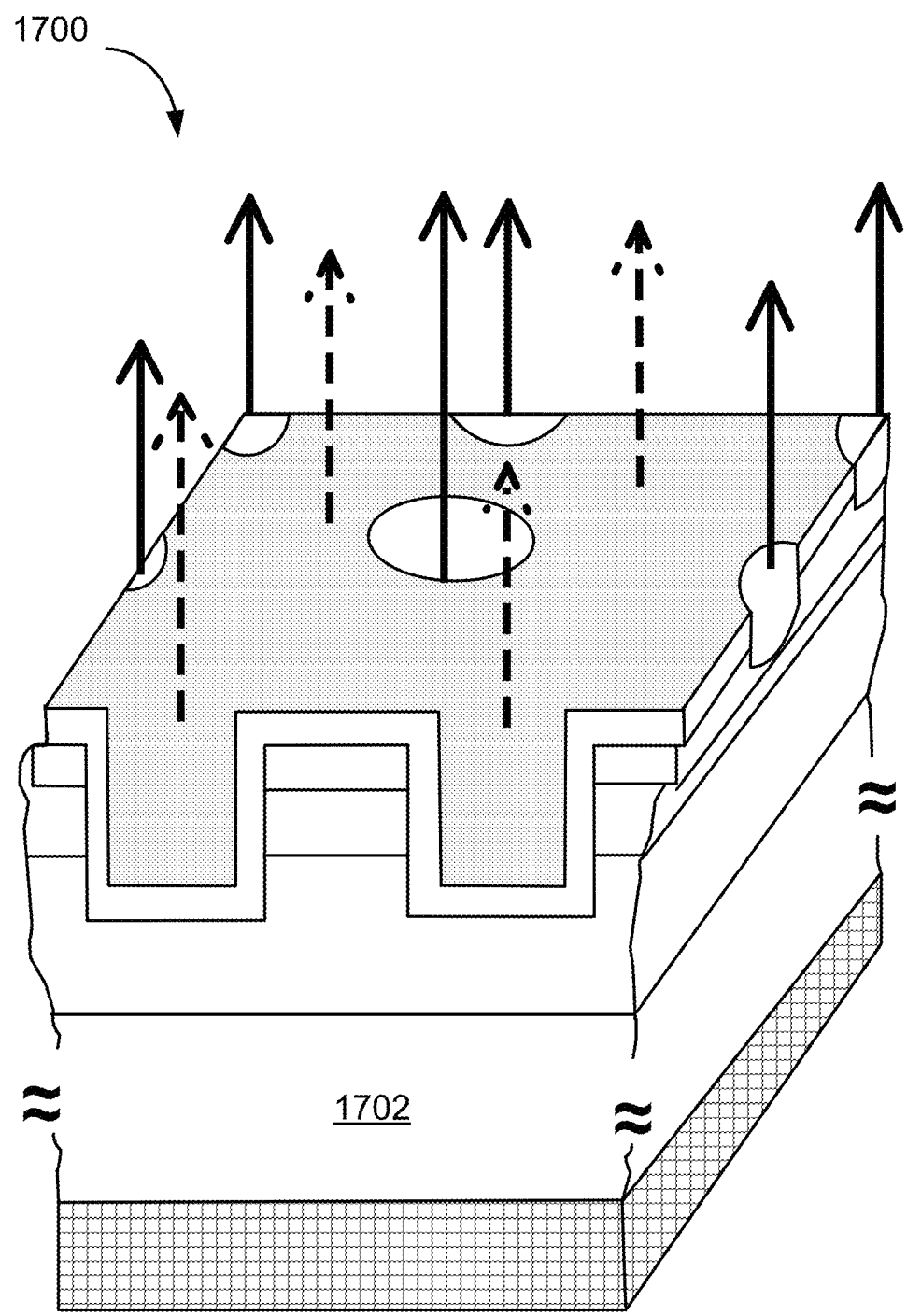
FIG. 17 illustrates an embodiment of an insulated gate bipolar transistor (IGBT).

In one embodiment, as illustrated in FIG. 17, the present disclosure provides an insulated gate bipolar transistor (IGBT) with circular trenches. The transistor 1700 may be formed utilizing either embodiment described above with respect to FIGS. 3 through 9 and 10 through 14, except that the N+ doped substrate may be exchanged with a P+ doped substrate 1702. Referring again to FIG. 16, the IGBT may be used as switch 1610 in a power conversion system 1600. In some embodiments, the IGBT may be utilized in smart grid applications, wherein the electrical network may be monitored by overlying the electrical network with two-way communication capabilities. Such capabilities may provide sensing, measurement and control of devices operably coupled to the network.

Figure 18A:
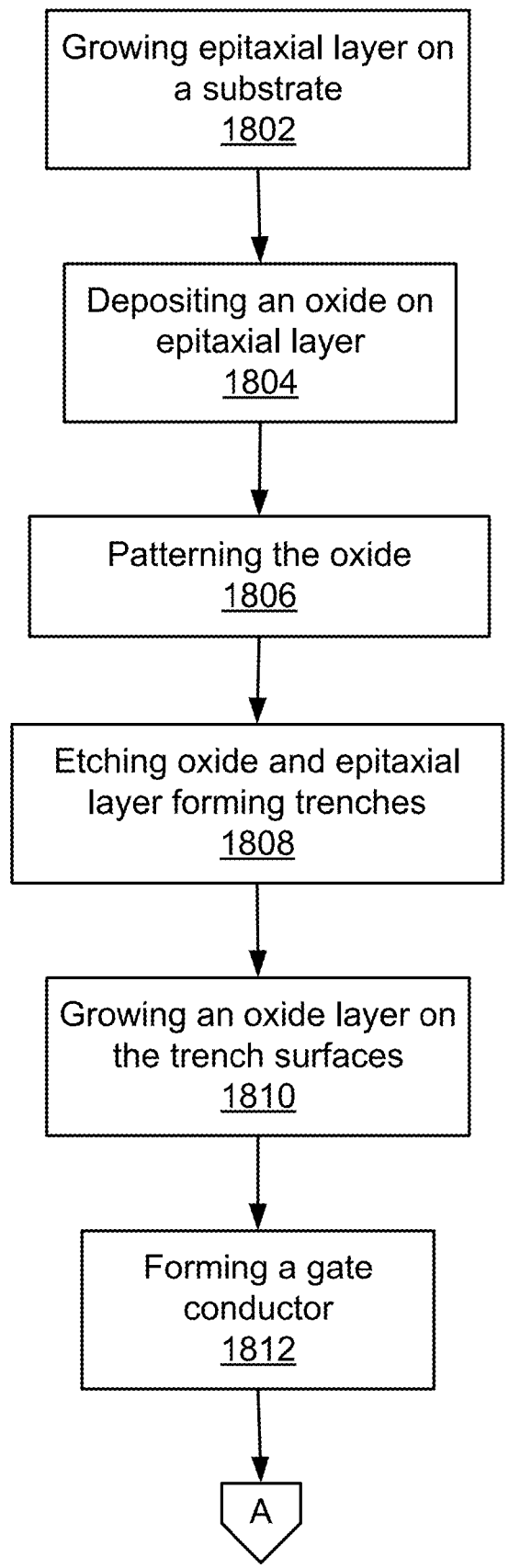
FIGS. 18a, 18b and 18c illustrate an embodiment of a method of forming a trench MOSFET.

As alluded to above, a method of fabricating a transistor may be provided as illustrated in FIG. 18a. The method may generally include growing an epitaxial layer on a substrate 1802, depositing an oxide, such as the hard oxide, on the epitaxial layer 1804, patterning the oxide 1806, etching the oxide and epitaxial layer to form at least one circular trench 1808, wherein the trench surfaces are defined by the epitaxial layer. The method may also include growing an oxide layer on the trench surfaces 1810 and forming a gate conductor within the at least one trench 1812.

Figure 18B:
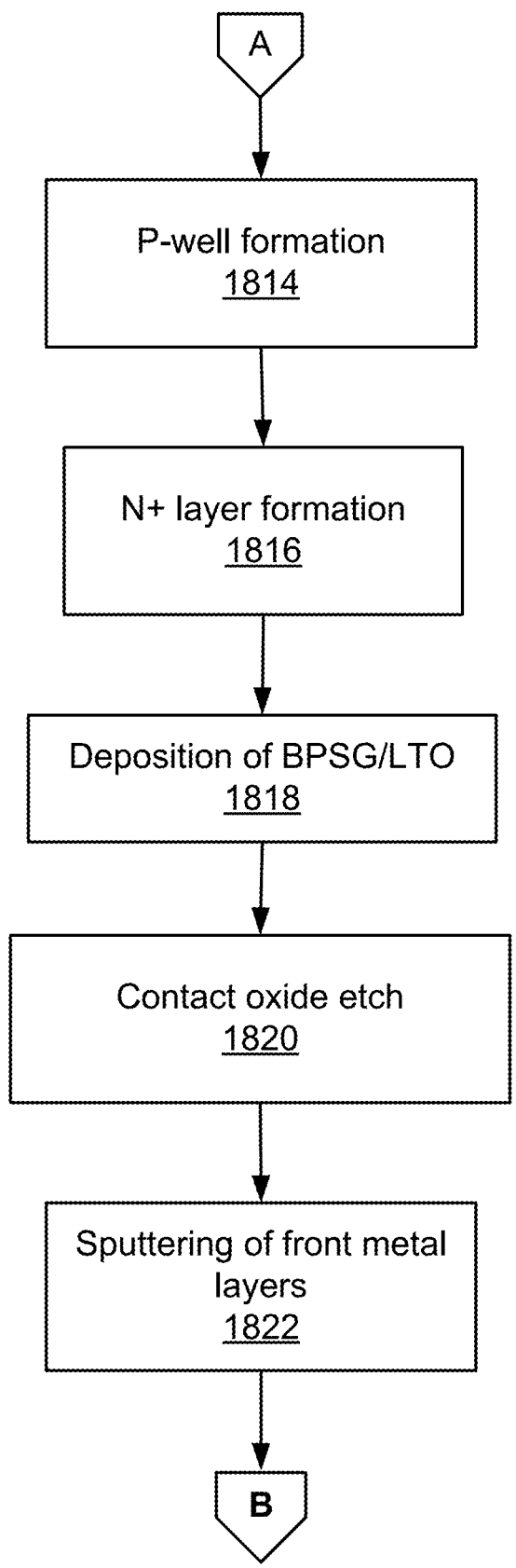
Figure 18C:
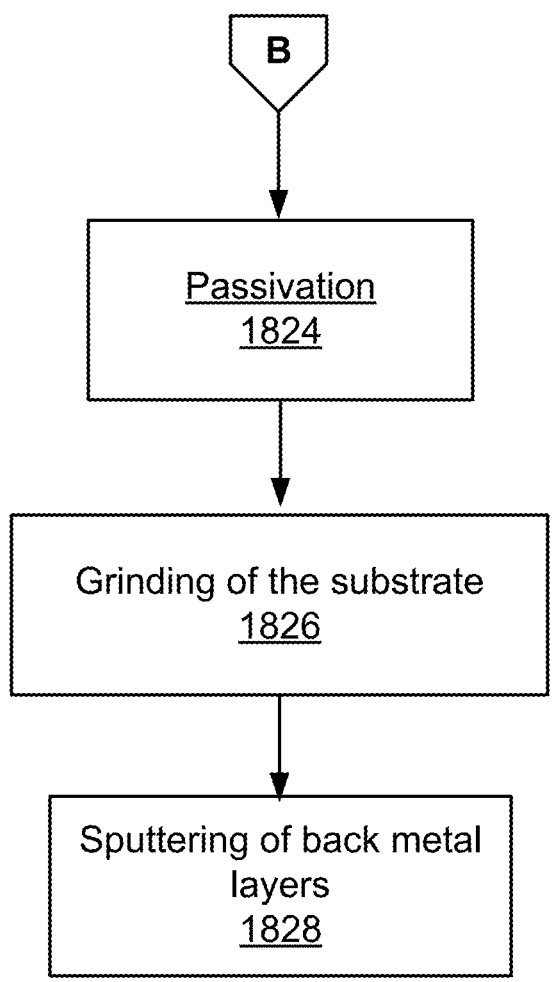

P-well formation 1814 may follow the formation of the gate conductors as illustrated in FIGS. 18b and 18c. In some embodiments, prior to P-well formation, the substrate may be patterned. P-well formation may then occur via implantation and driving of the P-well dopant into the epitaxial layer. After P-well formation 1814, the N+ layer may then be formed 1816. In some embodiments, prior to forming the N+ layer the surface of the substrate may be patterned and after formation of the N+ layer, the photoresist may be stripped.

In some embodiments, BPSG/LTO may then be deposited over the epitaxial layer 1818 and patterned. The BPSG/LTO may be patterned and the oxide etched 1820 to provide for contacts. Tungsten plugs may optionally be provided. Metalization layers may then be sputtered 1822 over the BPSG/LTO. As illustrated in FIG. 18c, the passivation of the metalized layer may be provided 1824, which may in some embodiments, end the front side process. The wafer may then be ground 1826, which may reduce RDSON and improve heat dissipation. After that, the back metal layers of the substrate may be sputtered 1828. Thus, the process for fabricating a trench MOSFET may be completed.

Figure 19A:
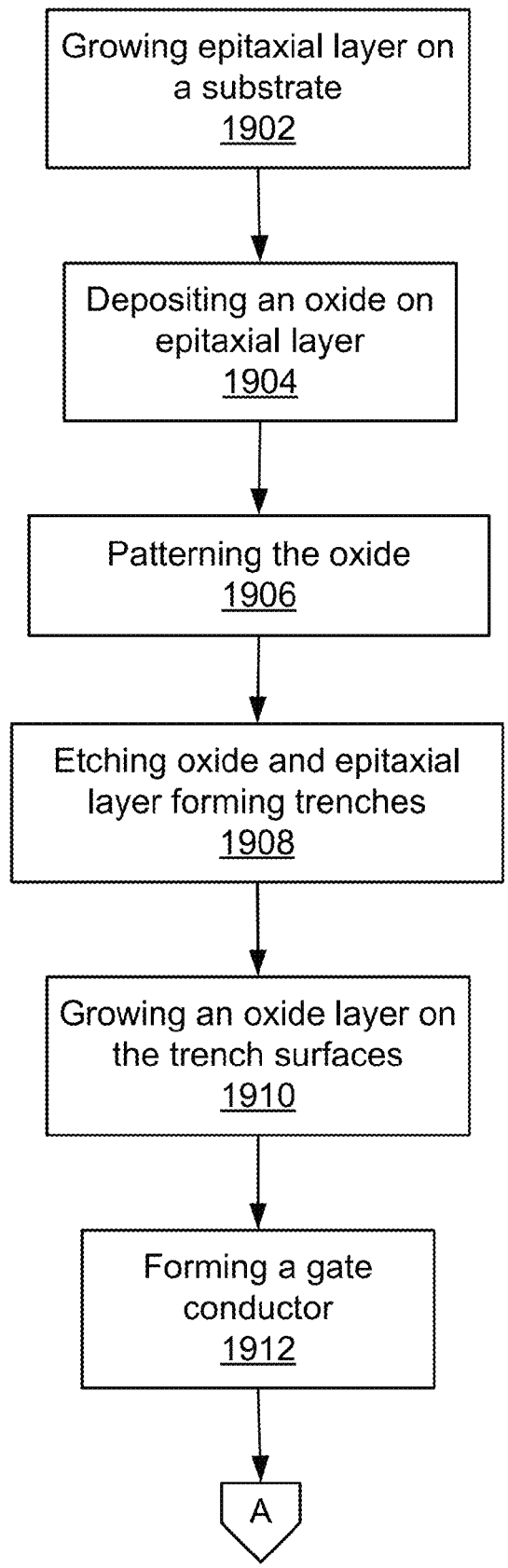
FIGS. 19a, 19b and 19c illustrate another embodiment of a method of forming a trench MOSFET.
Figure 19B:
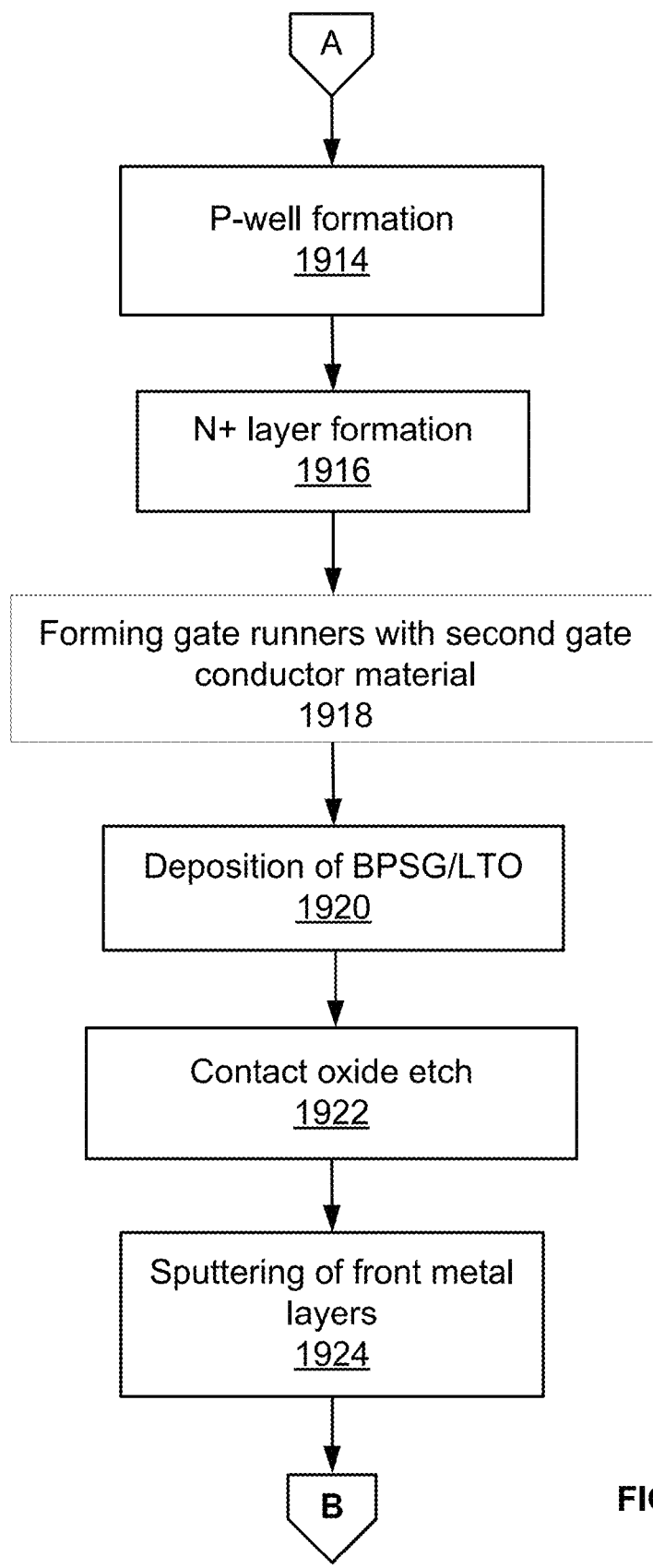
Figure 19C:
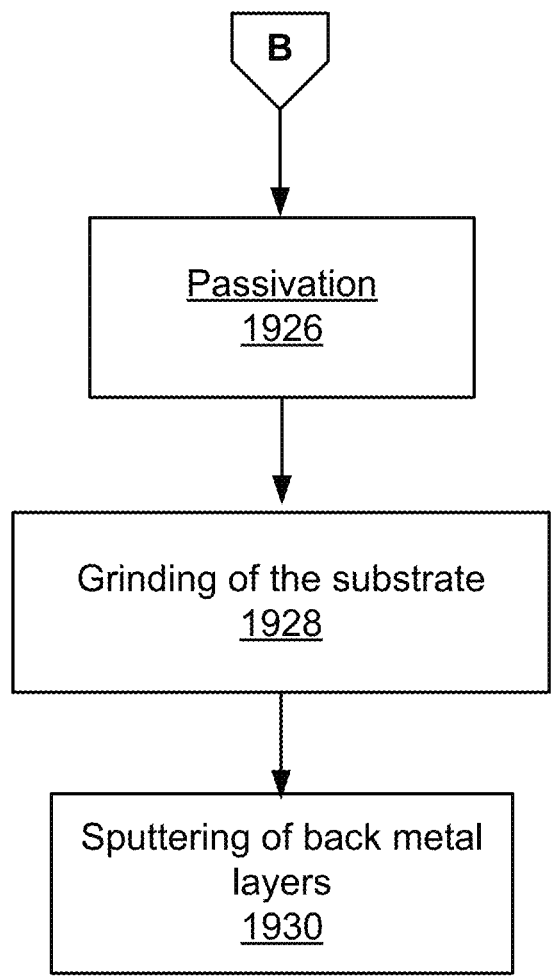

Another embodiment of a method of fabricating a transistor may be provided as illustrated in FIGS. 19a through 19c. As illustrated in FIG. 19a, the method may generally include growing an epitaxial layer on a substrate 1902, depositing an oxide, such as the hard oxide, on the epitaxial layer 1904, patterning the oxide 1906, etching the oxide and epitaxial layer to form at least one circular trench 1908, wherein the trench surfaces are defined by the epitaxial layer. The method may also include growing an oxide layer on the trench surfaces 1910 and forming a gate conductor within the at least one trench 1912.

P-well formation 1914 may follow the formation of the gate conductors as illustrated in FIGS. 19b and 19c. In some embodiments, prior to P-well formation, the substrate may be patterned. P-well formation may then occur via implantation and driving of the P-well dopant into the epitaxial layer. After P-well formation 1914, the N+ layer may then be formed 1916. In some embodiments, prior to forming the N+ layer the surface of the substrate may be patterned and after formation of the N+ layer, the photoresist may be stripped.

Prior to depositing BPSG/LTO over the epitaxial layer 1920, a second gate conductor material, such as polysilicon, may be deposited and patterned 1918. After the BPSG/LTO is deposited 1920 and patterned, the oxide may be etched 1922 to provide for contacts. Tungsten plugs may optionally be provided. Metalization layers may then be sputtered 1924 over the BPSG/LTO. As illustrated in FIG. 19c, the passivation of the metalized layer may be provided 1926, which may in some embodiments, end the front side process. The wafer may then be ground 1928, which may reduce RDSON and improve heat dissipation. After that, the back metal layers of the substrate may be sputtered 1930. Thus, the process for fabricating a trench MOSFET may be completed.

The foregoing description of several methods and embodiments has been presented for purposes of illustration. It is not intended to be exhaustive or to limit the claims to the precise steps and/or forms disclosed, and obviously many modifications and variations are possible in light of the above teaching. It is intended that the scope of the invention be defined by the claims appended hereto.

What is claimed is:

1. A transistor, comprising:
an epitaxial layer; and
a plurality of trenches, each trench comprising:
a circular cross-section,
a trench surface defined by the epitaxial layer,
a gate oxide disposed over the entire trench surface, and
a gate conductor deposited within the trench.

2. The transistor of claim 1, further comprising P-type dopants implanted in the epitaxial layer forming a P+ contact.

3. The transistor of claim 2, wherein:
the gate conductors deposited within the plurality of trenches comprise at least four gate conductors surrounding the P+ contact.

4. The transistor of claim 1, further comprising:
a P-well surrounding at least one trench of the plurality of trenches, wherein the P-well is embedded into the epitaxial layer beneath the surface of the epitaxial layer; and
an N+ layer comprising N+ type dopants implanted in the epitaxial layer between the P-well and the surface of the epitaxial layer.

5. The transistor of claim 1, wherein the epitaxial layer is disposed on an N+ doped substrate and the transistor is a metal oxide semiconductor field effect transistor (MOSFET).

6. The transistor of claim 1, wherein the epitaxial layer is disposed on a P+ doped substrate and the transistor is an insulated gate bipolar transistor (IGBT).

7. The transistor of claim 1, wherein the gate conductor comprises a compound selected from the group consisting of GaN, SiC, Si, and Ge.

8. A power conversion system comprising at least one switch, wherein the switch comprises a transistor including an epitaxial layer and a plurality of trenches, each trench comprising:
a circular cross-section,
a trench surface defined by the epitaxial layer,
a gate oxide disposed over the entire trench surface, and
a gate conductor deposited within the trench.

9. The power conversion system of claim 8, wherein the transistor further includes P-type dopants implanted in the epitaxial layer forming a P+ contact.

10. The power conversion system of claim 9, wherein:
the gate conductors deposited within the plurality of trenches surround the P+ contact; and
the ratio of the gate conductors to the P+ contact is in the range of 1:1 to 6:1.

11. The power conversion system of claim 8, wherein:
the transistor further includes a P-well surrounding at least one trench of the plurality of trenches;
the P-well is embedded into the epitaxial layer beneath the surface of the epitaxial layer; and
the transistor further includes an N+ layer comprising N+ type dopants implanted in the epitaxial layer between the P-well and the surface of the epitaxial layer.

12. The power conversion system of claim 8, wherein the epitaxial layer is disposed on an N+ doped substrate and the transistor is a metal oxide semiconductor field effect transistor (MOSFET).

13. The power conversion system of claim 8, wherein the epitaxial layer is disposed on a P+ doped substrate and the transistor is an insulated gate bipolar transistor (IGBT).

14. A method of fabricating a transistor, comprising:
growing an epitaxial layer on a substrate;
depositing a first oxide layer on the epitaxial layer;
coating a photo resist over the first oxide layer and patterning the photo resist;

etching the first oxide layer and epitaxial layer to form a plurality of trenches, each trench having a circular cross-section and having a trench surface defined by the epitaxial layer;

growing a second oxide layer on the entire trench surfaces of the plurality of trenches;

forming a gate conductor within each trench.

15. The method of claim 14, further comprising:

forming a P-well in the epitaxial layer; and forming an N+ layer in the epitaxial layer between the P-well and the surface of the epitaxial layer surface.

16. The method of claim 14, further comprising:

implanting P-type dopants in the epitaxial layer to form at least one P+ contact.

17. The transistor of claim 1, further comprising:

a P-well implanted in the epitaxial layer; and a plurality of P+ contacts implanted in the P-well, wherein:
  the plurality of P+ contacts are electrically connected together, and
  each P+ contact is surrounded by at least one trench of the plurality of trenches.

18. The transistor of claim 17, wherein the gate conductors are electrically connected to a gate pad, and wherein the P+ contacts are electrically connected to a source pad.

19. The transistor of claim 1, wherein a bottom surface of the gate conductor physically contacts an entire upper surface of the gate oxide.

20. The transistor of claim 1, wherein an upper surface of the gate conductor in each trench has an extension that extends to and electrically connects the gate conductor in an adjacent trench.

21. The transistor of claim 1, wherein the gate conductors deposited within the plurality of trenches are electrically connected together.

22. The power conversion system of claim 8, wherein the gate conductors deposited within the plurality of trenches are electrically connected together.

23. The method of claim 14, further comprising:

electrically connecting the gate conductors deposited within the plurality of trenches together.

* * * * *